(12) United States Patent
Higashi et al.

(10) Patent No.: US 8,390,055 B2
(45) Date of Patent: Mar. 5, 2013

(54) NONVOLATILE SEMICONDUCTOR MEMORY DEVICE

(75) Inventors: Kazuyuki Higashi, Yokohama (JP); Tadashi Iguchi, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 309 days.

(21) Appl. No.: 12/882,512

(22) Filed: Sep. 15, 2010

(65) Prior Publication Data

US 2011/0216597 A1   Sep. 8, 2011

(30) Foreign Application Priority Data

Mar. 3, 2010 (JP) ................................. 2010-046673

(51) Int. Cl.
*H01L 29/78* (2006.01)
(52) U.S. Cl. ................. 257/324; 257/390; 257/E29.309
(58) Field of Classification Search .................. 257/321, 257/324, 325, 390, E29.304, E29.309
See application file for complete search history.

(56) References Cited

U.S. PATENT DOCUMENTS

| | | | |
|---|---|---|---|
| 8,188,530 B2 * | 5/2012 | Tanaka et al. ................. | 257/314 |
| 2007/0252201 A1 | 11/2007 | Kito et al. | |
| 2009/0242967 A1 | 10/2009 | Katsumata et al. | |
| 2010/0207186 A1 * | 8/2010 | Higashi et al. ................. | 257/314 |
| 2011/0284946 A1 * | 11/2011 | Kiyotoshi ........................ | 257/324 |
| 2012/0070944 A1 * | 3/2012 | Kim et al. ........................ | 438/128 |

FOREIGN PATENT DOCUMENTS

JP   2007-266143   10/2007

OTHER PUBLICATIONS

Office Action issued Aug. 14, 2012 in Japanese Patent Application No. 2010-046673 with English translation.

* cited by examiner

*Primary Examiner* — Minh-Loan T Tran
(74) *Attorney, Agent, or Firm* — Oblon, Spivak, McClelland, Maier & Neustadt, L.L.P.

(57) ABSTRACT

A memory string comprises a semiconductor layer, a charge storage layer, and a plurality of first conductive layers. The semiconductor layer includes a columnar portion that extends in a perpendicular direction to a substrate. The charge storage layer is formed around a side surface of the columnar portion. The plurality of first conductive layers are formed around the side surface of the columnar portion and the charge storage layer. A control circuit comprises a plurality of second conductive layers, an insulating layer, and a plurality of plug layers. The plurality of second conductive layers are formed in the same layers as the plurality of first conductive layers. The insulating layer is formed penetrating the plurality of second conductive layers in the perpendicular direction. The plurality of plug layers are formed penetrating the insulating layer in the perpendicular direction. The insulating layer has a rectangular shaped cross-section with a constricted portion in a horizontal direction to the substrate. The constricted portion is positioned on a long side of the cross-section.

12 Claims, 18 Drawing Sheets

FIG. 11
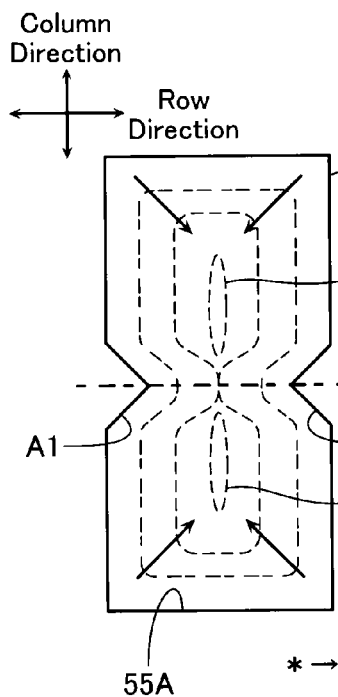
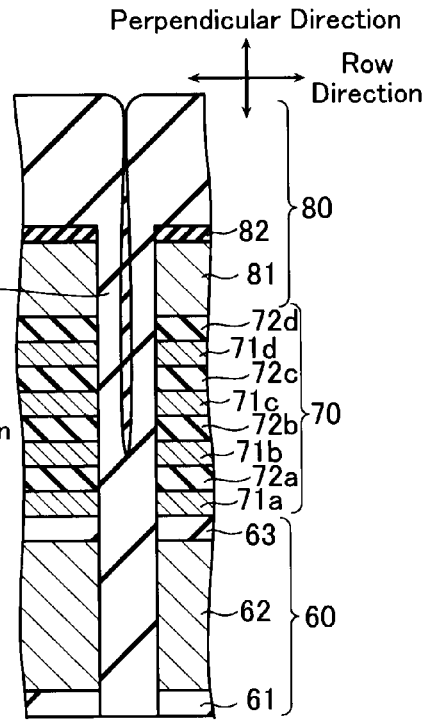
First Embodiment
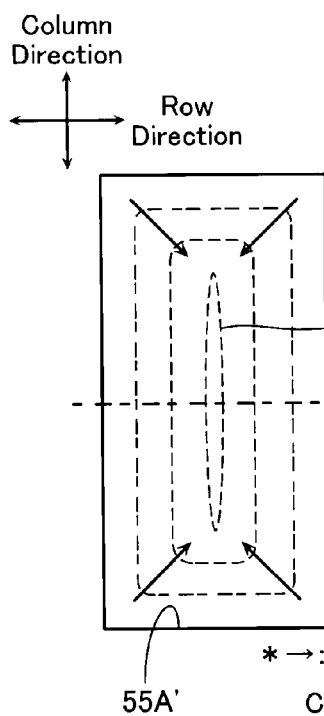
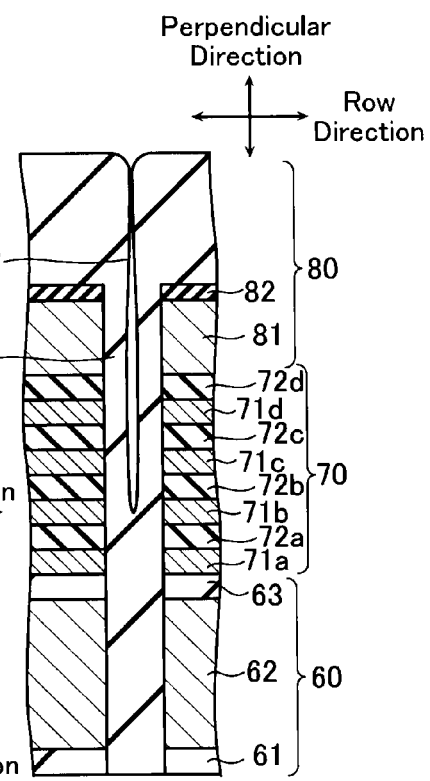
Comparative Example

NONVOLATILE SEMICONDUCTOR MEMORY DEVICE

CROSS REFERENCE TO RELATED APPLICATIONS

This application is based upon and claims the benefit of priority from the prior Japanese Patent Application No. 2010-46673, filed on Mar. 3, 2010, the entire contents of which are incorporated herein by reference.

BACKGROUND

1. Field

Embodiments described herein relate to an electrically data-rewritable nonvolatile semiconductor memory device.

2. Description of the Related Art

In recent years, many semiconductor memory devices are proposed in which memory cells are disposed three-dimensionally in order to increase a degree of integration of memory.

For example, one conventional semiconductor memory device in which memory cells are disposed three-dimensionally uses a transistor with a cylindrical column type structure. The transistor with the cylindrical column type structure includes a conductive layer stacked in multiple layers and configured to form a pillar-shaped columnar semiconductor layer, a memory gate insulating layer, and a gate electrode. The columnar semiconductor layer functions as a channel (body) portion of the transistor. The memory gate insulating layer is formed in a periphery of the columnar semiconductor layer and configured to enable storage of a charge. The conductive layer is formed around the columnar semiconductor layer with the memory gate insulating layer interposed therebetween. Such a three-dimensional structure enables increased capacity to be achieved not through miniaturization but through multilayering, and a manufacturing process may be performed using a technology that is an extension of conventional technology.

Through manufacturing processes for the above-described transistor with the cylindrical column type structure, an upper wiring, a lower wiring, and a plug layer used in a control circuit of the transistor are formed. The upper wiring is provided in an upper portion of the conductive layer, the lower wiring is provided in a lower portion of the conductive layer, and the plug layer is formed extending in a perpendicular direction so as to connect the upper wiring and the lower wiring.

Further, the plug layer is formed as below. That is, first, a penetrating hole is formed penetrating the conductive layer in a portion of a region. Next, an interlayer insulating layer is formed filing the penetrating hole. Then, a plurality of holes are formed penetrating the interlayer insulating layer, and a plug layer formed within each of the holes. However, when the interlayer insulating layer is formed, a void is formed in the interlayer insulating layer if coverage of the filling material of the interlayer insulating layer is insufficient. A plurality of penetrating holes subsequently formed therein may be electrically connected to each other via the void. That is, a plurality of plug layers are short-circuited via the void, and stability of operation in the nonvolatile semiconductor memory device is impaired.

BRIEF DESCRIPTION OF THE DRAWINGS

FIG. 11 shows views explaining advantages of the first embodiment.

DETAILED DESCRIPTION

Figure 1:
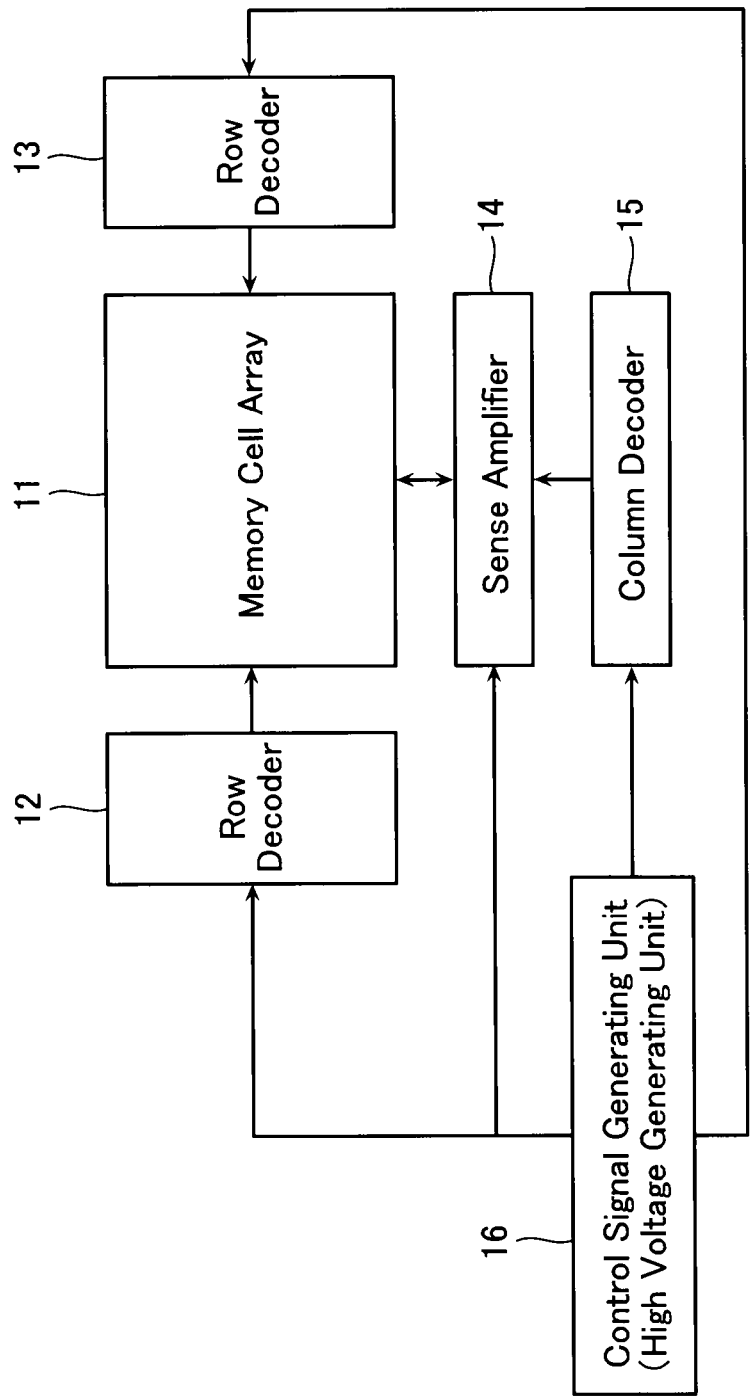
FIG. 1 is a block diagram of a nonvolatile semiconductor memory device in accordance with a first embodiment.

According to one embodiment, a nonvolatile semiconductor memory device comprises a plurality of memory strings, and a control circuit for controlling the memory strings. The plurality of memory strings each has a plurality of electrically rewritable memory transistors connected in series. Each of the memory strings comprises a semiconductor layer, a charge storage layer, and a plurality of first conductive layers. The semiconductor layer includes a columnar portion that extends in a perpendicular direction to a substrate, and functions as a body of the memory transistors. The charge storage layer is formed around a side surface of the columnar portion, and be configured to enable storage of a charge. The plurality of first conductive layers are formed around the side surface of the columnar portion and the charge storage layer, and function as gates of the memory transistors. The control circuit comprises a plurality of second conductive layers, an insulating layer, and a plurality of plug layers. The plurality of second conductive layers are formed in the same layers as the plurality of first conductive layers. The insulating layer is formed penetrating the plurality of second conductive layers in the perpendicular direction. The plurality of plug layers are formed penetrating the insulating layer in the perpendicular direction. The insulating layer has a rectangular shaped cross-section with a constricted portion in a horizontal direction to the substrate. The constricted portion is positioned on a long side of the cross-section.

According to one embodiment, a nonvolatile semiconductor memory device comprises a plurality of memory strings, and a control circuit for controlling the memory strings. The plurality of memory strings each has a plurality of electrically rewritable memory transistors connected in series. Each of the memory strings comprises a semiconductor layer, a charge storage layer, and a plurality of first conductive layers. The semiconductor layer includes a columnar portion that extends in a perpendicular direction to a substrate, and functions as a body of the memory transistors. The charge storage layer is formed around a side surface of the columnar portion, and be configured to enable storage of a charge. The plurality of first conductive layers are formed around the side surface of the columnar portion and the charge storage layer, and function as gates of the memory transistors. The control circuit comprises a plurality of second conductive layers, an insulating layer, and a plurality of plug layers. The plurality of second conductive layers are formed in the same layers as the plurality of first conductive layers. The insulating layer is formed penetrating the plurality of second conductive layers in the perpendicular direction. The plurality of plug layers are formed penetrating the insulating layer in the perpendicular direction. The insulating layer has a rectangular shaped cross-section in a horizontal direction to the substrate, and comprises a void positioned at a center of the cross-section. Where a length of a short side of the cross-section is defined as La and a width of the void is defined as W, each of the plurality of plug layers is formed between the short side and a position distant from the short side by a length $La/2-W/2$.

According to one embodiment, a nonvolatile semiconductor memory device comprises a plurality of memory strings, and a control circuit for controlling the memory strings. The plurality of memory strings each has a plurality of electrically rewritable memory transistors connected in series. Each of the memory strings comprises a semiconductor layer, a charge storage layer, and a plurality of first conductive layers. The semiconductor layer includes a columnar portion that extends in a perpendicular direction to a substrate, and functions as a body of the memory transistors. The charge storage layer is formed around a side surface of the columnar portion, and be configured to enable storage of a charge. The plurality of first conductive layers are formed around the side surface of the columnar portion and the charge storage layer, and function as gates of the memory transistors. The control circuit comprises a plurality of second conductive layers, an insulating layer, and a plurality of plug layers. The plurality of second conductive layers are formed in the same layers as the plurality of first conductive layers. The insulating layer is formed penetrating the plurality of second conductive layers in the perpendicular direction. The plurality of plug layers are formed penetrating the insulating layer in the perpendicular direction. The insulating layer has a rectangular shaped cross-section in a horizontal direction to the substrate, and comprises a void positioned at a center of the cross-section. Where a length of a short side of the cross-section is defined as La and a width of the void is defined as W, each of the plurality of plug layers is formed between a long side and a position distant from the long side by a length $La/2-W/2$.

Embodiments of a nonvolatile semiconductor memory device in accordance with the present invention are described below with reference to the drawings.

First Embodiment

[Configuration]

First, a configuration of a nonvolatile semiconductor memory device in accordance with a first embodiment is described with reference to FIGS. 1 and 2. FIG. 1 is a block diagram of the nonvolatile semiconductor memory device in accordance with the first embodiment of the present invention, and FIG. 2 is a schematic perspective view of the nonvolatile semiconductor memory device.

As shown in FIG. 1, the nonvolatile semiconductor memory device in accordance with the first embodiment comprises a memory cell array 11, row decoders 12 and 13, a sense amplifier 14, a column decoder 15, and a control signal generating unit (high voltage generating unit) 16.

Figure 2:
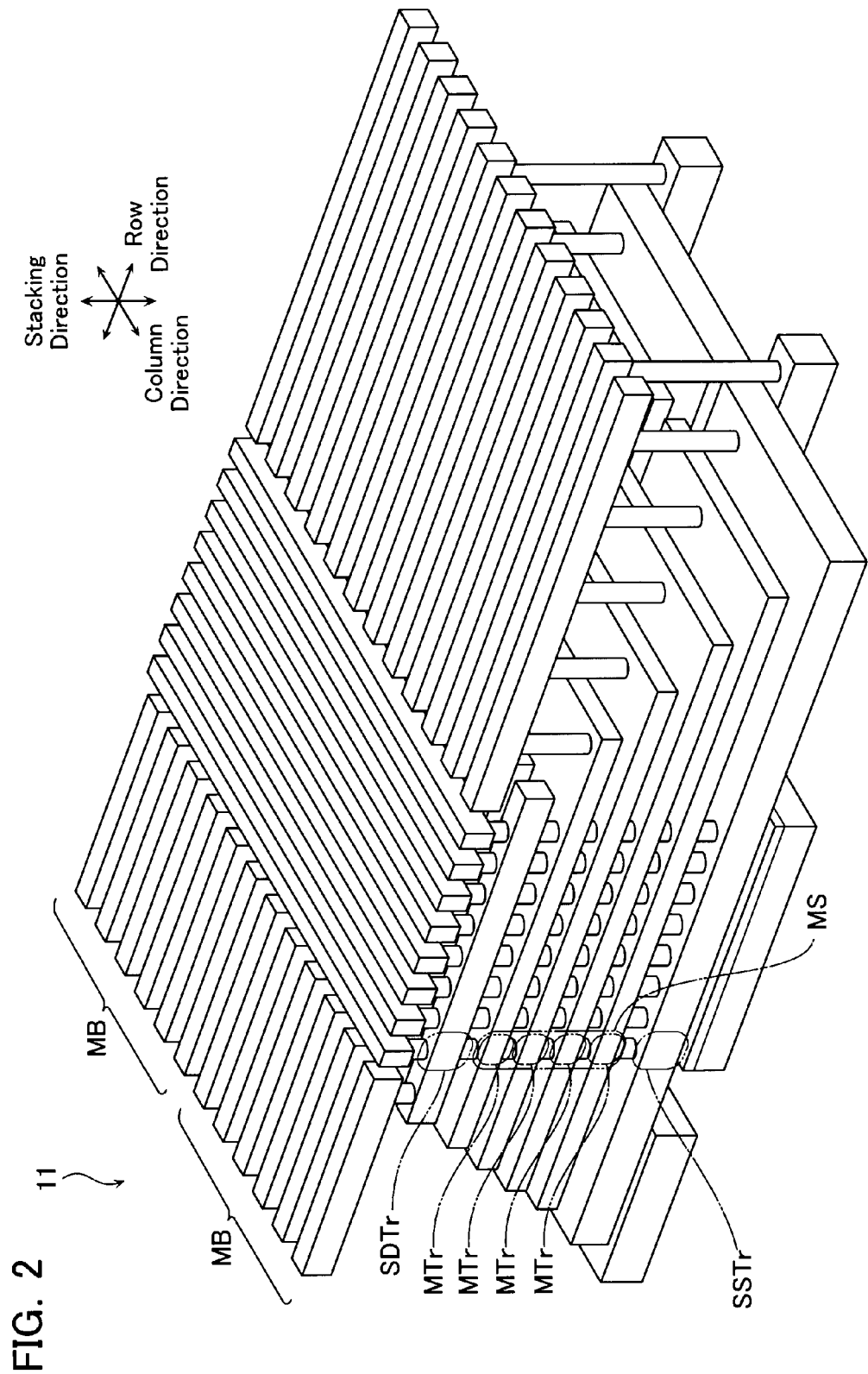
FIG. 2 is a schematic perspective view of the nonvolatile semiconductor memory device in accordance with the first embodiment.

As shown in FIG. 2, the memory cell array 11 is configured having electrically data-storing memory transistors MTr arranged in a three-dimensional matrix. That is, the memory transistors MTr, as well as being arranged in a matrix in a horizontal direction, are also arranged in a stacking direction (direction perpendicular to a substrate). A plurality of the memory transistors MTr aligned in the stacking direction are connected in series to configure a publicly known NAND string (memory string) MS. Connected to the two ends of the memory string MS are, respectively, a drain side select transistor SDTr and a source side select transistor, SSTr, which are rendered conductive when selected. This memory string MS is arranged having the stacking direction as a long direction.

As shown in FIG. 1, the row decoders 12 and 13 decode a block address signal and so on inputted thereto, and control the memory cell array 11. The sense amplifier 14 reads data from the memory cell array 11. The column decoder 15 decodes a column address signal and controls the sense amplifier 14. The control signal generating unit 16 boosts a reference voltage to generate a high voltage required during write and erase, and, further, generates a control signal to control the row decoders 12 and 13, the sense amplifier 14, and the column decoder 15.

Figure 3:
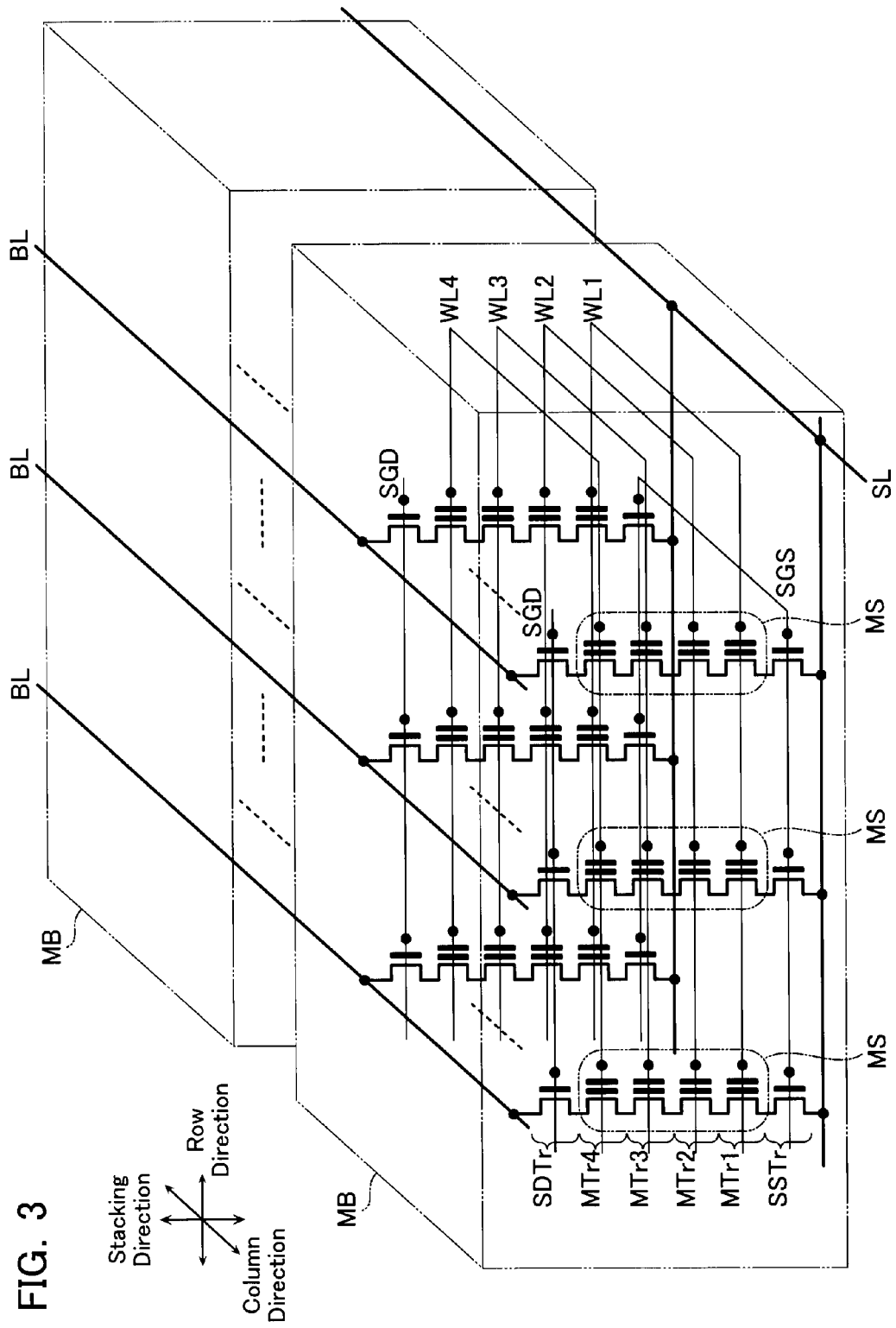
FIG. 3 is a circuit diagram of a memory cell array 11 shown in FIG. 2.

Next, a circuit configuration of the memory cell array 11 is described with reference to FIG. 3. As shown in FIG. 3, the memory cell array 11 includes a plurality of memory blocks MB. The memory block MB comprises a plurality of the memory strings MS, source side select transistors SSTr, and drain side select transistors SDTr. The memory string MS is configured by memory transistors MTr1-MTr4 connected in series. The drain side select transistor SDTr is connected to one end of the memory string MS (memory transistor MTr4). The source side select transistor SSTr is connected to the other end of the memory string MS (memory transistor MTr1). The memory strings MS are provided in a matrix over a plurality of rows and columns for each individual memory block MB, for example. Note that the memory string MS may be configured by more than four memory transistors.

As shown in FIG. 3, control gates of the memory transistors MTr1 in the memory block MB arranged in a matrix are commonly connected to a word line WL1. Similarly, control gates of the memory transistors MTr2-MTr4 are commonly connected to word lines WL2-WL4, respectively.

As shown in FIG. 3, control gates of each of the drain side select transistors SDTr in the memory block MB arranged in a line in a row direction are commonly connected to a drain side select gate line SGD. A plurality of the drain side select gate lines SGD, each extending in the row direction, are provided in each individual memory block MB with a certain pitch in a column direction. Moreover, other ends of the drain side select transistors SDTr arranged in a line in the column direction are commonly connected to a bit line BL. The bit line BL is formed extending in the column direction straddling the memory blocks MB. A plurality of the bit lines BL are provided in the row direction.

As shown in FIG. 3, control gates of all the source side select transistors SSTr in each individual memory block MB are commonly connected to a source side select gate line SGS. Moreover, other ends of the source side select transistors SSTr are commonly connected to a source line SL.

Figure 4:
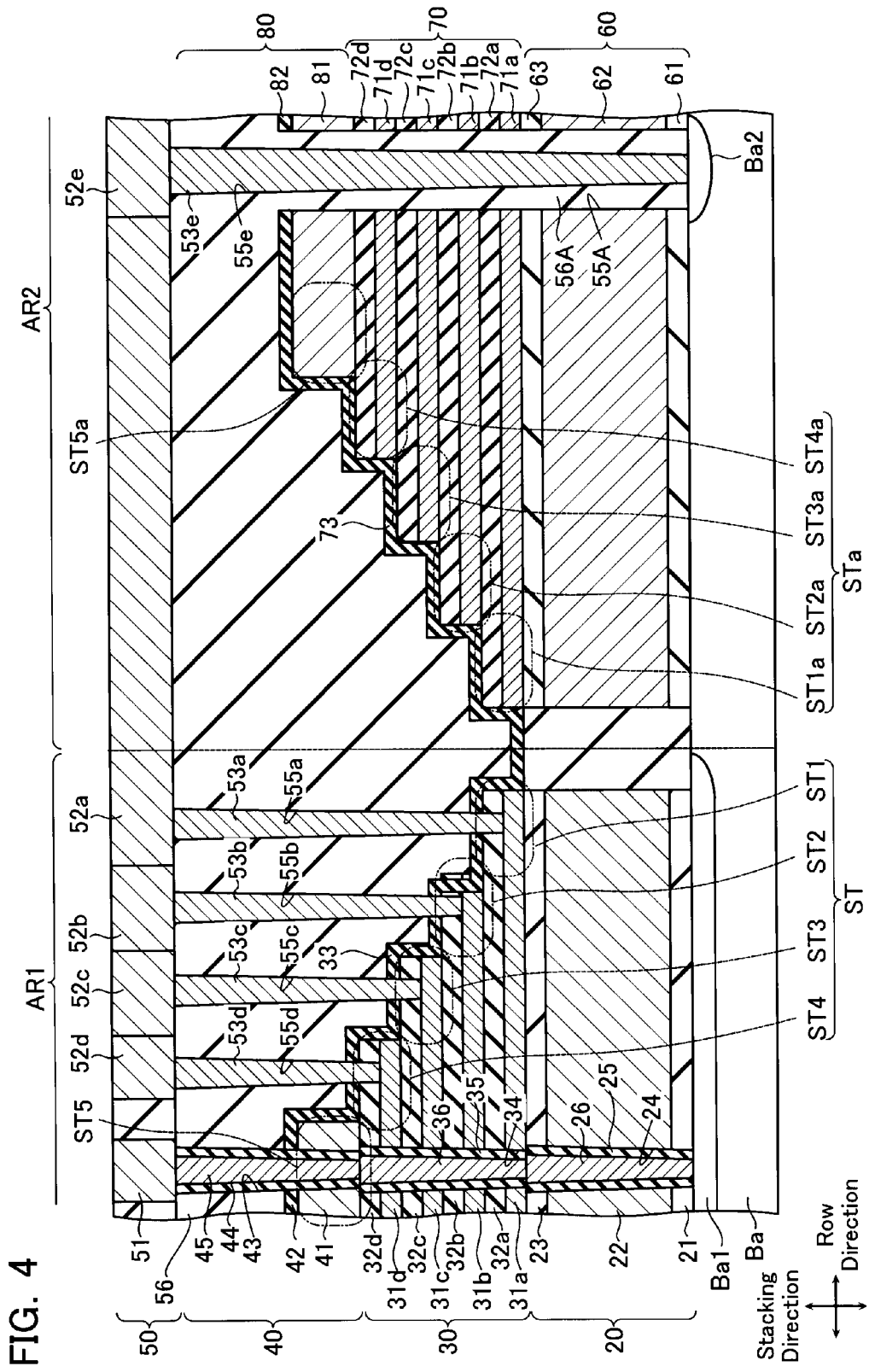
FIG. 4 is a cross-sectional view of the nonvolatile semiconductor memory device in accordance with the first embodiment.

The above-described circuit configuration of the nonvolatile semiconductor memory device is realized by a stacking structure shown in FIG. 4. FIG. 4 is a cross-sectional view of the nonvolatile semiconductor memory device in accordance with the first embodiment.

As shown in FIG. 4, the nonvolatile semiconductor memory device in accordance with the first embodiment has a memory region AR1 and a peripheral region AR2 stacked on a semiconductor substrate Ba. The memory region AR1 functions as the memory cell array 11. The peripheral region AR2 is provided in a periphery of the memory region AR1 and functions as various control circuits (12-16).

First, the memory region AR1 is described with reference to FIG. 4. The memory region AR1 includes, for each of the memory blocks MB, a source side select transistor layer 20, a memory transistor layer 30, a drain side select transistor layer 40, and a wiring layer 50, stacked sequentially on the semiconductor substrate Ba, as shown in FIG. 4.

The semiconductor substrate Ba in the memory region AR1 functions as the source line SL. The source side select transistor layer 20 functions as the source side select transistor SSTr. The memory transistor layer 30 functions as the memory string MS (memory transistors MTr1-MTr4). The drain side select transistor layer 40 functions as the drain side select transistor SDTr. The wiring layer 50 functions as the bit line BL and as various other wiring.

The semiconductor substrate Ba includes in its upper surface a diffusion region Ba1. The diffusion region Ba1 functions as the source line SL.

The source side select transistor layer 20 includes an insulating layer 21, a source side conductive layer 22, and an insulating layer 23, stacked sequentially on the semiconductor substrate Ba, as shown in FIG. 4. The source side conductive layer 22 functions as a gate of the source side select transistor SSTr and as the source side select gate line SGS. The source side conductive layer 22 is formed extending two-dimensionally in the row direction and the column direction (in a plate-like shape) along an entirety of each individual memory block MB.

The insulating layers 21 and 23 are constituted by silicon oxide ($SiO_2$). The source side conductive layer 22 is constituted by polysilicon (poly-Si).

Moreover, as shown in FIG. 4, the source side select transistor layer 20 includes a source side hole 24. The source side hole 24 is formed penetrating the insulating layer 21, the source side conductive layer 22, and the insulating layer 23. The source side holes 24 are formed in a matrix in the row direction and the column direction.

Additionally, as shown in FIG. 4, the source side select transistor layer 20 includes a source side gate insulating layer 25 and a source side columnar semiconductor layer 26. The source side columnar semiconductor layer 26 functions as a body (channel) of the source side select transistor SSTr.

The source side gate insulating layer 25 is formed with a certain thickness on a side wall of the source side hole 24. The source side columnar semiconductor layer 26 is formed in contact with a side surface of the source side gate insulating layer 25 so as to fill the source side hole 24. The source side columnar semiconductor layer 26 is formed in a column shape extending in the stacking direction. The source side columnar semiconductor layer 26 is formed on the diffusion layer Ba1 on the semiconductor substrate Ba.

The source side gate insulating layer 25 is constituted by silicon oxide ($SiO_2$). The source side columnar semiconductor layer 26 is constituted by polysilicon (poly-Si).

Expressing the above-described configuration of the source side select transistor layer 20 in other words, the source side gate insulating layer 25 is formed around the source side columnar semiconductor layer 26. The source side conductive layer 22 is formed around the source side columnar semiconductor layer 26 with the source side gate insulating layer 25 interposed therebetween.

The memory transistor layer 30 includes word line conductive layers 31a-31d, insulating layers 32a-32d, and a protective layer 33, stacked sequentially on the source side select transistor layer 20, as shown in FIG. 4. The word line conductive layers 31a-31d function as gates of the memory transistors MTr1-MTr4 and as the word lines WL1-WL4.

The word line conductive layers 31a-31d and the insulating layers 32a-32d are formed extending two-dimensionally in the row direction and the column direction (in a plate-like shape). The word line conductive layers 31a-31d and the insulating layers 32a-32d are divided on a memory block MB basis.

In addition, the word line conductive layers 31a-31d and the insulating layers 32a-32d are formed in a stepped shape such that positions of ends thereof in the row direction facing the peripheral region AR2 differ from one another, as shown in FIG. 4. That is, the ends in the row direction of the word line conductive layers 31a-31d and the insulating layers 32a-32d configure a stepped portion ST formed in a stepped shape. The stepped portion ST is formed descending in the row direction towards the peripheral region AR2. The stepped portion ST includes steps ST1-ST4 arranged in a line in the row direction. The steps ST1-ST4 are each configured by an end of one of the word line conductive layers 31a-31d and an end of one of the insulating layers 32a-32d. The steps ST1-ST4 are covered by the protective layer 33. Note that formed on the protective layer 33 is an interlayer insulating layer 56.

The word line conductive layers 31a-31d are constituted by polysilicon (poly-Si). The insulating layers 32a-32d are constituted by silicon oxide ($SiO_2$). The protective layer 33 is constituted by silicon nitride (SiN).

Moreover, the memory transistor layer 30 includes a memory hole 34, as shown in FIG. 4. The memory hole 34 is formed penetrating the word line conductive layers 31a-31d and the insulating layers 32a-32d. The memory holes 34 are formed in a matrix in the row direction and the column direction. The memory hole 34 is formed at a position aligning with the source side hole 24.

Additionally, as shown in FIG. 4, the memory transistor layer 30 includes a memory gate insulating layer 35 and a memory columnar semiconductor layer 36. The memory columnar semiconductor layer 36 functions as a body (channel) of the memory transistors MTr1-MTr4.

The memory gate insulating layer 35 is formed with a certain thickness on a side wall of the memory hole 34. The memory columnar semiconductor layer 36 is formed in contact with a side surface of the memory gate insulating layer 35 so as to fill the memory hole 34. The memory columnar semiconductor layer 36 is formed in a column shape extending in the stacking direction. The memory columnar semiconductor layer 36 has its lower surface formed in contact with an upper surface of the source side columnar semiconductor layer 26.

Figure 5:
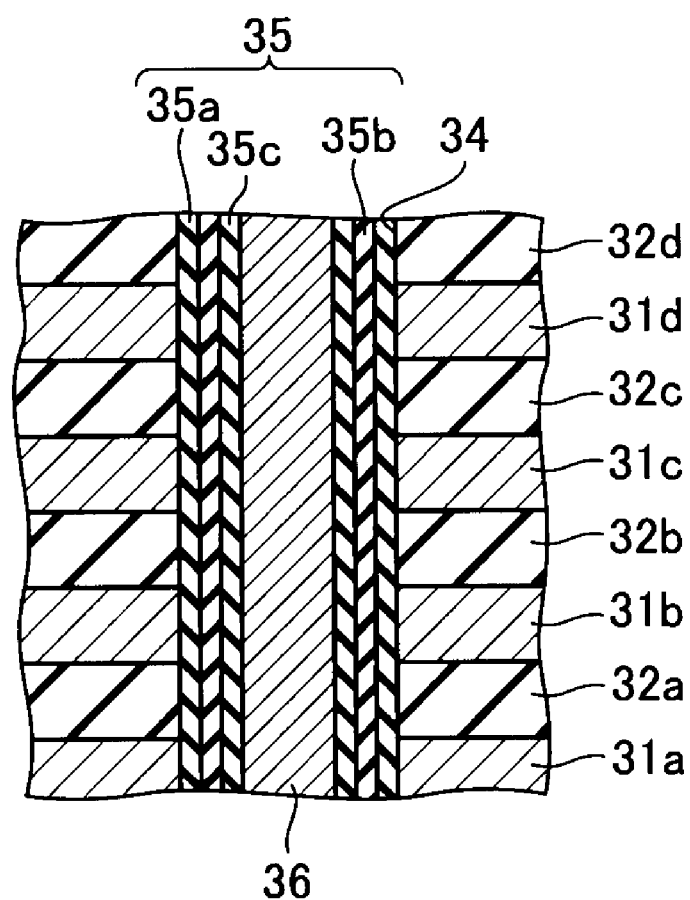
FIG. 5 is an enlarged view of FIG. 4.

A configuration of the memory gate insulating layer 35 is described here in detail with reference to FIG. 5. FIG. 5 is an enlarged view of FIG. 4. The memory gate insulating layer 35 includes, from a side of a side surface of the memory hole 34 to a side of the memory columnar semiconductor layer 36, a block insulating layer 35a, a charge storage layer 35b, and a tunnel insulating layer 35c. The charge storage layer 35b is configured to enable storage of a charge.

The block insulating layer 35a is formed with a certain thickness on the side wall of the memory hole 34, as shown in FIG. 5. The charge storage layer 35b is formed with a certain thickness on a side wall of the block insulating layer 35a. The tunnel insulating layer 35c is formed with a certain thickness on a side wall of the charge storage layer 35b.

The block insulating layer 35a and the tunnel insulating layer 35c are constituted by silicon oxide ($SiO_2$). The charge storage layer 35b is constituted by silicon nitride (SiN). The memory columnar semiconductor layer 36 is constituted by polysilicon (poly-Si).

Expressing the above-described configuration of the memory transistor layer 30 in other words, the tunnel insulating layer 35c is formed around the memory columnar semiconductor layer 36. The charge storage layer 35b is formed around the tunnel insulating layer 35c. The block insulating layer 35a is formed around the charge storage layer 35b. The word line conductive layers 31a-31d are formed around the block insulating layer 35a.

The drain side select transistor layer 40 includes a drain side conductive layer 41 and a protective layer 42, as shown in FIG. 4. The drain side conductive layer functions as a gate of the drain side select transistor SDTr and as the drain side select gate line SGD.

The drain side conductive layer 41 is stacked on the memory transistor layer 30. The drain side conductive layer 41 is formed directly above where the memory columnar semiconductor layer 36 is formed. The drain side conductive layer 41 is formed in stripes extending in the row direction and having a certain pitch in the column direction. Moreover, a position of an end in the row direction of the drain side conductive layer 41 is formed so as to differ from a position of an end in the row direction of the word line conductive layer 31d, thereby configuring a step ST5.

The protective layer 42 is formed continuously in an integrated manner with the protective layer 33 so as to cover the drain side conductive layer 41. Note that formed on the protective layer 42 is the interlayer insulating layer 56.

The drain side conductive layer 41 is constituted by, for example, polysilicon (poly-Si). The protective layer 42 is constituted by silicon nitride (SiN).

Moreover, as shown in FIG. 4, the drain side select transistor layer 40 includes a drain side hole 43. The drain side hole 43 is formed penetrating the drain side conductive layer 41 and the protective layer 42. The drain side holes 43 are formed in a matrix in the row direction and the column direction. The drain side hole 43 is formed at a position aligning with the memory hole 34.

Additionally, as shown in FIG. 4, the drain side select transistor layer 40 includes a drain side gate insulating layer 44 and a drain side columnar semiconductor layer 45. The drain side columnar semiconductor layer 45 functions as a body (channel) of the drain side select transistor SDTr.

The drain side gate insulating layer 44 is formed with a certain thickness on a side wall of the drain side hole 43. The drain side columnar semiconductor layer 45 is formed in contact with the drain side gate insulating layer 44 so as to fill the drain side hole 43. The drain side columnar semiconductor layer 45 is formed in a column shape extending in the stacking direction. The drain side columnar semiconductor layer 45 has its lower surface formed in contact with the upper surface of the memory columnar semiconductor layer 36.

The drain side gate insulating layer 44 is constituted by silicon oxide ($SiO_2$). The drain side columnar semiconductor layer 45 is constituted by polysilicon (poly-Si).

Expressing the above-described configuration of the drain side select transistor layer 40 in other words, the drain side gate insulating layer 44 is formed around the drain side columnar semiconductor layer 45. The drain side conductive layer 41 is formed around the drain side columnar semiconductor layer 45 with the drain side gate insulating layer 44 interposed therebetween.

The wiring layer 50 includes a first wiring layer 51 and a second wiring layer 52 (52a-52d), as shown in FIG. 4. The first wiring layer 51 functions as the bit line BL. The second wiring layer 52 functions as various wiring connected to the word lines WL1-WL4.

The first wiring layer 51 and the second wiring layers 52a-52d are provided in a layer above the drain side select transistor layer 40. The first wiring layer 51 is formed in contact with an upper surface of the drain side columnar semiconductor layer 45. The first wiring layer 51 is formed extending in the column direction with a certain pitch in the row direction. The second wiring layers 52a-52d are formed extending in the row direction with a certain pitch in the column direction.

Plug layers 53a-53d and penetrating holes 55a-55d are formed penetrating the interlayer insulating layer 56, the protective layer 33, and the respective insulating layers 32a-32d. The plug layers 53a-53d are formed filling the respective penetrating holes 55a-55d. The plug layers 53a-53d are formed connecting lower surfaces of each of the second wiring layers 52a-52d to upper surfaces of each of the word line conductive layers 31a-31d. The first wiring layer 51, the second wiring layer 52, and the plug layers 53a-53d are constituted by tungsten (W).

Next, the peripheral region AR2 is described with reference to FIG. 4. The peripheral region AR2 includes a peripheral wiring layer 60, a first dummy layer 70, a second dummy layer 80, and the wiring layer 50, stacked sequentially on the semiconductor substrate Ba, as shown in FIG. 4.

Formed in the semiconductor substrate Ba in the peripheral region AR2 are sources/drains of transistors and other wiring configuring the row decoder 12 and so on. The peripheral wiring layer 60 functions as a gate of the transistors and the other wiring configuring the row decoder 12 and so on. The first dummy layer 70 and the second dummy layer 80 are layers where a plug layer 53e is formed, the plug layer 53e extending from a layer above the first dummy layer 70 and the second dummy layer 80 to the peripheral wiring layer 60 or the semiconductor substrate Ba, and do not function as any wiring.

The semiconductor substrate Ba includes in its surface a diffusion layer Ba2. The diffusion layer Ba2 functions as the sources/drains of the transistors and the other wiring configuring the row decoder 12 and so on.

As shown in FIG. 4, the peripheral wiring layer 60 is formed in the same layer as the source side select transistor layer 20. The first dummy layer 70 is formed in the same layer as the memory transistor layer 30. The second dummy layer 80 is formed in the same layer as the drain side select transistor layer 40. The peripheral wiring layer 60, the first dummy layer 70, and the second dummy layer 80 are formed as the same layers with the source side select transistor layer 20, the memory transistor layer 30, and the drain side select transistor layer 40, respectively, before they are processed. The peripheral wiring layer 60, the first dummy layer 70, and the second dummy layer 80 are divided from the source side select transistor layer 20, the memory transistor layer 30, and the drain side select transistor layer 40 by etching. Note that the wiring layer 50 has a common configuration in the memory region AR1 and the peripheral region AR2.

The peripheral wiring layer 60 includes an insulating layer 61, a conductive layer 62, and an insulating layer 63, stacked sequentially on the semiconductor substrate Ba. The conductive layer 62 functions as the gates of the transistors and the other wiring configuring the row decoder 12. The insulating layer 61 is formed in the same layer as the insulating layer 21. The conductive layer 62 is formed in the same layer as the source side conductive layer 22. The insulating layer 63 is formed in the same layer as the insulating layer 23.

In addition, the peripheral wiring layer 60 includes a penetrating hole 55A and an interlayer insulating layer 56A. The penetrating hole 55A and the interlayer insulating layer 56A are formed penetrating the insulating layer 61, the conductive layer 62, and the insulating layer 63. The penetrating hole 55A is formed at a position aligning with the diffusion layer Ba2. The interlayer insulating layer 56A is formed filling the penetrating hole 55A. Note that, as mentioned hereafter, the penetrating hole 55A and the interlayer insulating layer 56A are commonly provided to the peripheral wiring layer 60, the first dummy layer 70, and the second dummy layer 80. The interlayer insulating layer 56A is formed continuously in an integrated manner with the interlayer insulating layer 56.

The first dummy layer 70 includes conductive layers 71a-71d, insulating layers 72a-72d, and a protective layer 73, stacked sequentially on the peripheral wiring layer 60, as shown in FIG. 4.

The conductive layers 71a-71d are formed in the same layers as the word line conductive layers 31a-31d. The insulating layers 72a-72d are formed in the same layers as the insulating layers 32a-32d. In addition, the conductive layers 71a-71d and the insulating layers 72a-72d are formed in a stepped shape such that positions of ends thereof in the row direction facing the memory region AR1 differ from one another. That is, the ends in the row direction of the conductive layers 71a-71d and the insulating layers 72a-72d configure a stepped portion STa formed in a stepped shape. The stepped portion STa is formed descending in the row direction towards the memory region AR1. The stepped portion STa includes steps ST1a-ST4a arranged in a line in the row direction. The steps ST1a-ST4a are each configured by an end of one of the conductive layers 71a-71d and an end of one of the insulating layers 72a-72d, as shown in FIG. 4. The steps ST1a-ST4a have their ends in the row direction covered by the protective layer 73. Note that formed on the protective layer 73 is the interlayer insulating layer 56.

Moreover, the first dummy layer 70 includes the penetrating hole 55A and the interlayer insulating layer 56A. The penetrating hole 55A and the interlayer insulating layer 56A are formed penetrating the conductive layers 71a-71d and the insulating layers 72a-72d.

The second dummy layer 80 includes a conductive layer 81 and a protective layer 82, stacked on the first dummy layer 70, as shown in FIG. 4.

The conductive layer 81 is formed in the same layer as the drain side conductive layer 41. A position of an end in the row direction of the conductive layer 81 is formed so as to differ from a position of an end in the row direction of the conductive layer 71d, thereby configuring a step ST5a.

The protective layer 82 is formed continuously in an integrated manner with the protective layer 73 so as to cover the conductive layer 81. Note that formed on the protective layer 82 is the interlayer insulating layer 56.

In addition, the second dummy layer 80 includes the penetrating hole 55A and the interlayer insulating layer 56A. The penetrating hole 55A and the interlayer insulating layer 56A are formed penetrating the conductive layer 81 and the protective layer 82.

The wiring layer 50 includes a second wiring layer 52e, a plug layer 53e, and a penetrating hole 55e. The plug layer 53e and the penetrating hole 55e are formed penetrating the interlayer insulating layer 56A. The plug layer 53e is formed filling the penetrating hole 55e. The plug layer 53e extends in the perpendicular direction and electrically connects the diffusion layer Ba2 to the second wiring layer 52e.

Figure 6:
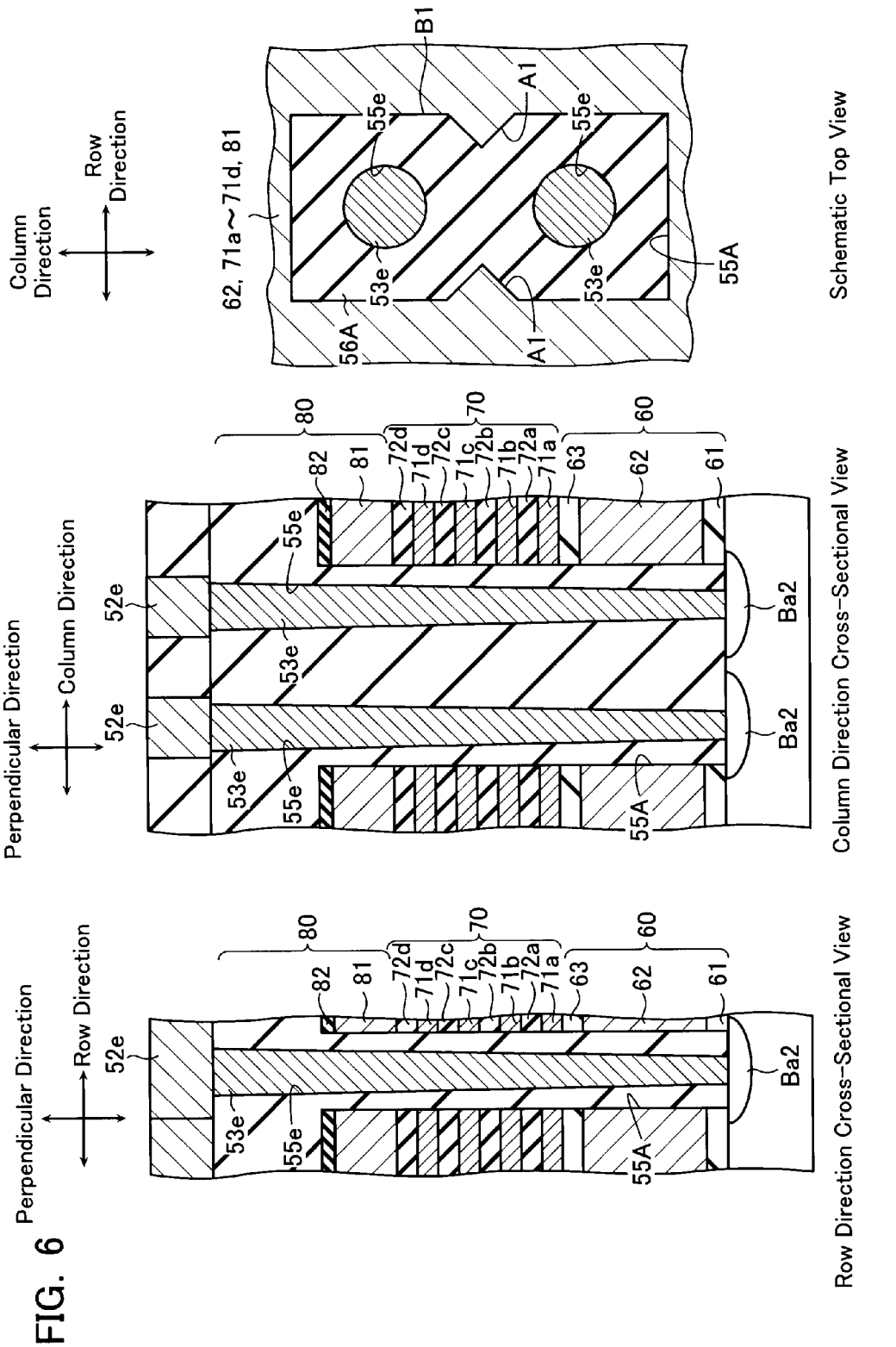
FIG. 6 shows cross-sectional views and a schematic top view of the nonvolatile semiconductor memory device in accordance with the first embodiment.

Next, the plug layer 53e and the penetrating hole 55A are described in detail with reference to FIG. 6. FIG. 6 shows a row direction cross-sectional view (the left side), a column direction cross-sectional view (the middle), and a schematic top view (the right side) of the plug layer 53e, the penetrating hole 55A, and the interlayer insulating layer 56A. Note that in the schematic top view (the right side) of FIG. 6, layers above the protective layer 82 are omitted.

As shown in the right side of FIG. 6, the interlayer insulating layer 56A (penetrating hole 55A) has a cross-section B1 in a horizontal direction with respect to the semiconductor substrate Ba that is of a rectangular shape having two constricted portions A1. The cross-section B1 has a pair of long sides extending in the column direction and a pair of short sides extending in the row direction. The two constricted portions A1 are formed facing each other at a midpoint vicinity of the long sides of the cross-section B1 (and are formed in alignment in a direction parallel to the short sides of the cross-section). In the right side of FIG. 6, the two constricted portions A1 have a triangular shape.

As shown in the middle and the right side of FIG. 6, there are two plug layers 53e formed in one interlayer insulating layer 56A (cross-section B1). The two plug layers 53e are disposed in a position other than the vicinity of a line connecting the constricted portions A1. The two plug layers 53e are each formed such that the distance from one of two long sides of the cross-section B1 is equal to that from the other. The two plug layers 53e are each formed at a position between a short sides of the cross-section B1 and the constricted portions A1. Moreover, the two plug layers 53e are disposed along a line in the direction parallel to the long sides of the cross-section B1.

[Method of Manufacturing]

Next, a method of manufacturing the nonvolatile semiconductor memory device in accordance with the first embodiment is described with reference to FIGS. 7-10. FIGS. 7-10 each show cross-sectional views and a schematic top view of a manufacturing process of the nonvolatile semiconductor memory device in accordance with the first embodiment. Specifically, FIGS. 7-10 show views of a process for forming the wiring layer 50 in the peripheral region AR2.

Figure 7:
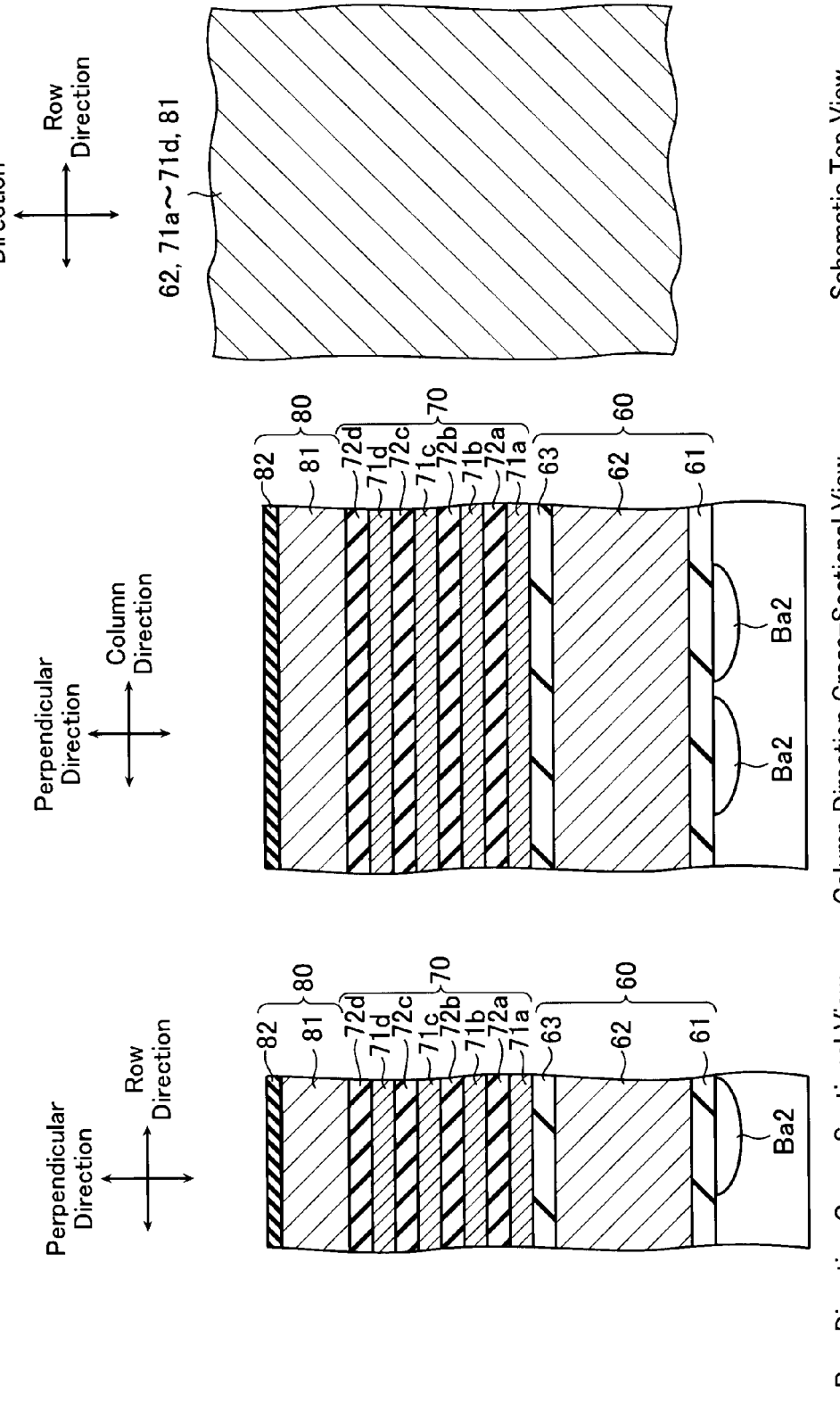
FIGS. 7 to 10 shows cross-sectional views and a schematic top views of a manufacturing process of the nonvolatile semiconductor memory device in accordance with the first embodiment.

First, the peripheral wiring layer 60, the first dummy layer 70, and the second dummy layer 80 are formed, as shown in FIG. 7.

Figure 8:
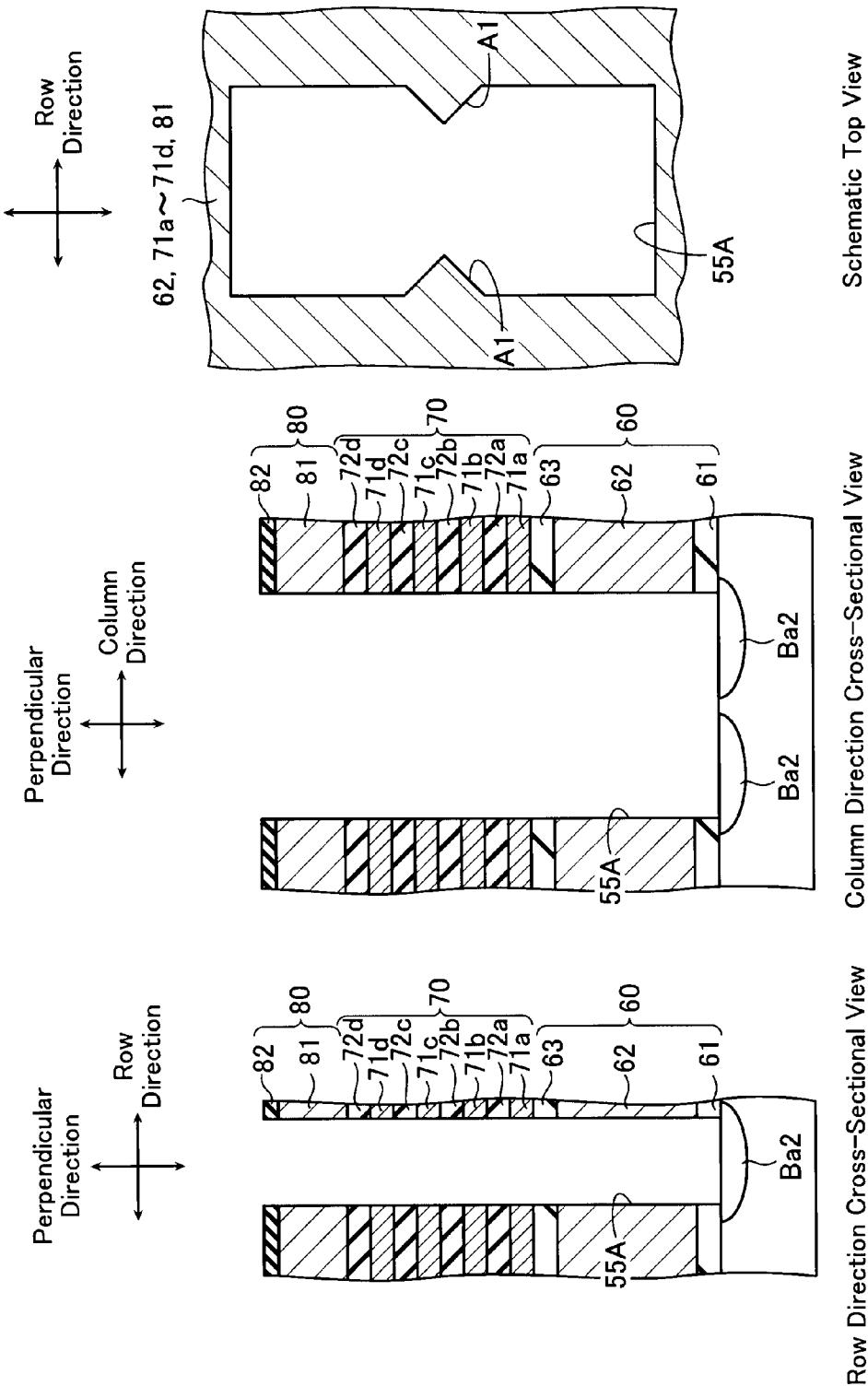

Then, the penetrating hole 55A is formed penetrating the peripheral wiring layer 60, the first dummy layer 70, and the second dummy layer 80, as shown in FIG. 8. The penetrating hole 55A is formed at a position aligning with the diffusion layer Ba2. The penetrating hole 55A is formed in the rectangular shape having the two constricted portions A1 in the horizontal direction. The penetrating hole 55A has the pair of long sides extending in the column direction and the pair of short sides extending in the row direction. The two constricted portions A1 are formed facing each other at a midpoint vicinity of the long sides of the cross-section B1.

Figure 9:
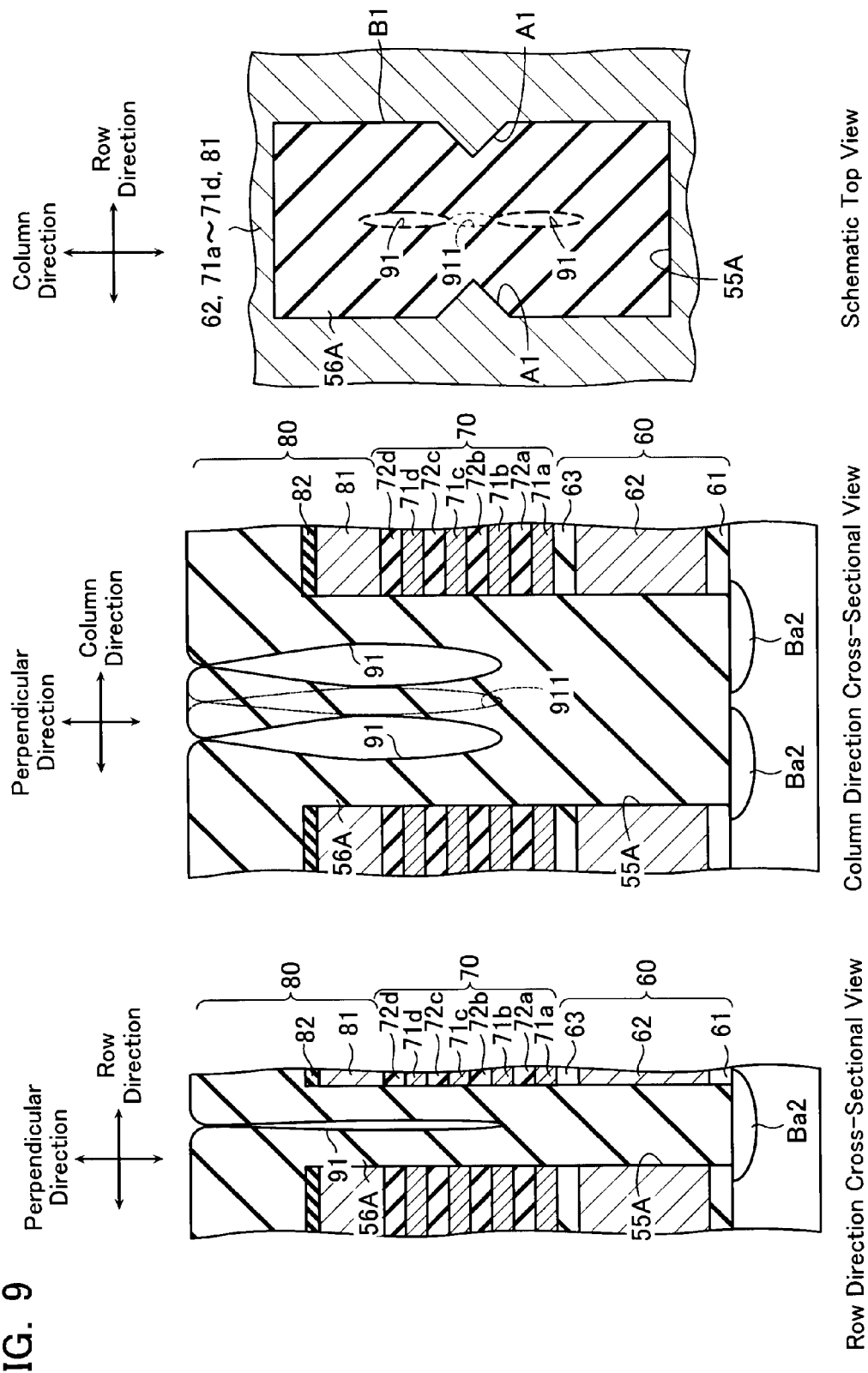

Subsequently, silicon oxide is deposited filling the penetrating hole 55A, thereby forming the interlayer insulating layer 56A, as shown in FIG. 9. That is, the interlayer insulating layer 56A is formed having the rectangular shaped cross-section B1 with the two constricted portions A1 in the horizontal direction. Note that the interlayer insulating layer 56A is deposited by CVD (Chemical Vapor Deposition).

Here, there are two voids 91 formed in one interlayer insulating layer 56A due to the shape of its cross-section B1, the two voids 91 extending downwardly from an upper surface of the interlayer insulating layer 56A and sandwiching the constricted portions A1. The two voids 91 are formed divided in a vicinity of the constricted portions A1. The two voids 91 are each formed along a line passing through a midpoint vicinity of the short sides of the cross-section B1 so as to have the direction parallel to the long sides of the cross-section B1 as a long axis. In addition, the two voids 91 are formed at a substantially equal distance from each of the two long sides of the cross-section B1. As shown in the right side of FIG. 9, prior to the two voids 91 being formed, a void 911 may also be formed in a vicinity of the constricted portions A1. However, deposition gas enters from a periphery of the void 911, whereby the void 911 is eventually filled. Consequently, the two voids 91 are formed in a divided state, not joined to each other.

Figure 10:
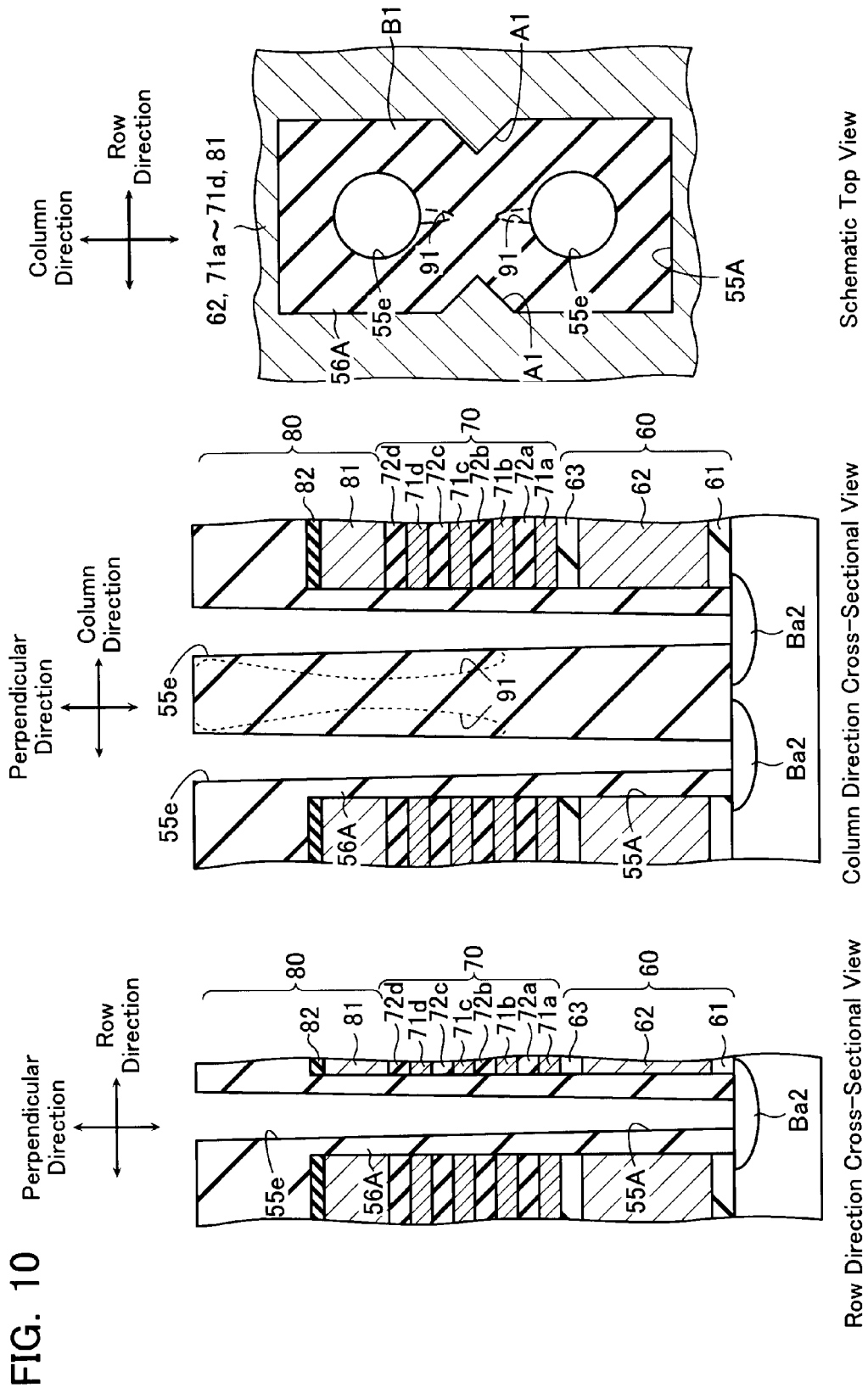

Next, the hole 55e is formed penetrating the interlayer insulating layer 56A, as shown in FIG. 10. Here, two of the holes 55e are formed within one interlayer insulating layer 56A. Following this, a metal such as tungsten is deposited filling the hole 55e, thereby forming the plug layer 53e.

[Advantages]

Next, the first embodiment is shown alongside a comparative example, and advantages of the first embodiment described with reference to FIG. 11. Now, in the first embodiment, as shown in the upper side of FIG. 11, the interlayer insulating layer 56A (penetrating hole 55A) has the cross-section B1 in the horizontal direction that is of the rectangular shape having the two constricted portions A1. In contrast, in the comparative example, as shown in the lower side of FIG. 11, an interlayer insulating layer 56A' (penetrating hole 55A') is assumed to have a cross-section B1' in the horizontal direction that is simply of rectangular shape. That is, the cross-section B1' is assumed not to have the constricted portions A1.

In a manufacturing process of the comparative example, as shown in the lower side of FIG. 11, the interlayer insulating layer 56A' is formed sequentially from side surfaces of the penetrating hole 55A' having the rectangular shape in the horizontal direction, eventually leaving a single void 91'. The void 91' passes through a central vicinity of the cross-section B1' and has an elliptical shape extending longer in the column direction (direction parallel to the long sides of the cross-section B1') than in the first embodiment. Therefore, when two holes 55e are formed in one interlayer insulating layer 56A' in the comparative example, the two holes 55e are linked via the void 91'. That is, when metal is deposited inside the two holes 55e to form the plug layers 53e, the two plug layers 53e are short-circuited by the metal deposited in the void 91'.

On the other hand, in the manufacturing process in the first embodiment, as shown in the upper side of FIG. 11, the interlayer insulating layer 56A is formed sequentially from side surfaces of the penetrating hole 55A of the rectangular shape in the horizontal direction having the constricted portions A1, eventually leaving the two voids 91. The two voids 91 are formed divided in the vicinity of the constricted portions A1. Therefore, when two holes 55e are formed in one interlayer insulating layer 56A in the first embodiment, there is no linking of the two holes 55e via the voids 91. That is, when metal is deposited inside the two holes 55e to form the plug layers 53e, the two plug layers 53e are provided in isolation from each other, and there is no short-circuiting thereof.

[Variant Examples of First Embodiment]

Next, variant examples of the first embodiment are described with reference to FIGS. 12-17. The variant examples are similar to the above-described first embodiment in having an interlayer insulating layer 56A (penetrating hole 55A) that has rectangular shaped cross-sections B2-B6 with constricted portions A1 (A2, A3) in the horizontal direction, and thereby display similar advantages to the first embodiment. The variant examples differ from the first embodiment in number of constricted portions, and position and shape of those constricted portions in the cross-sections B2-B6.

Figure 12:
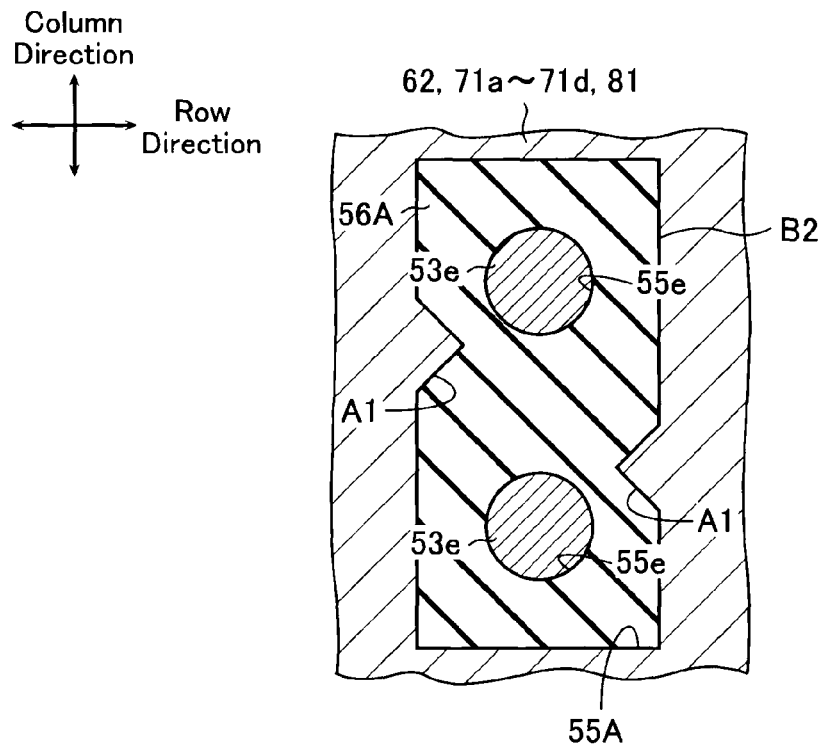
FIGS. 12 to 17 are a schematic top views showing a variant example of the first embodiment.
Figure 13:
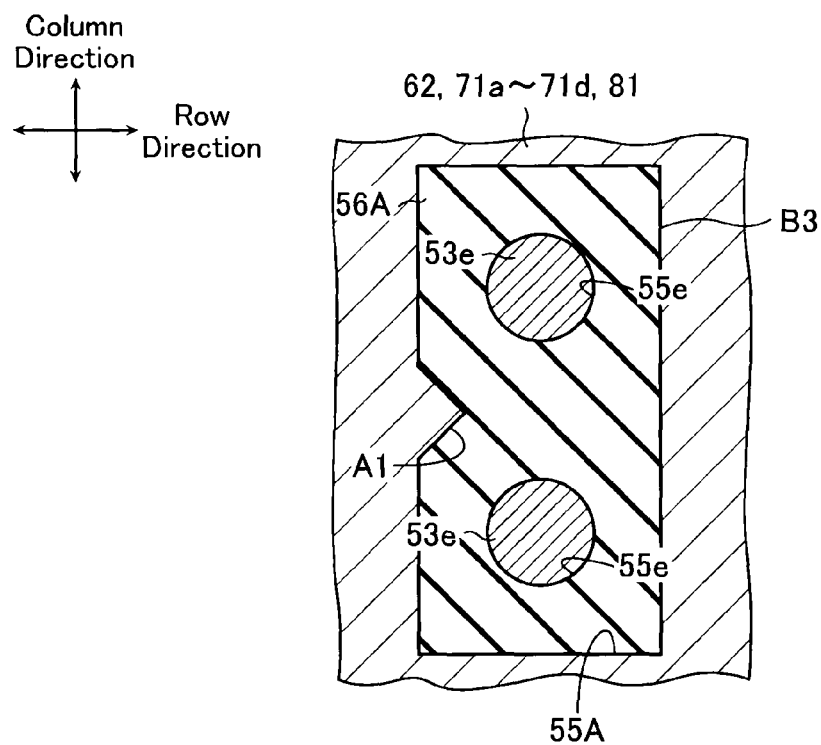
Figure 14:
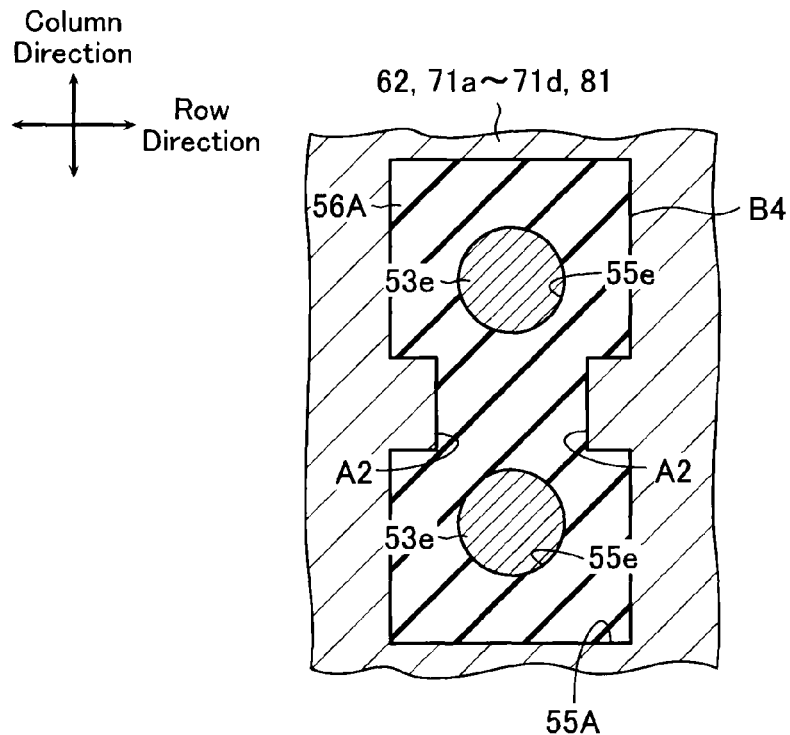
Figure 15:
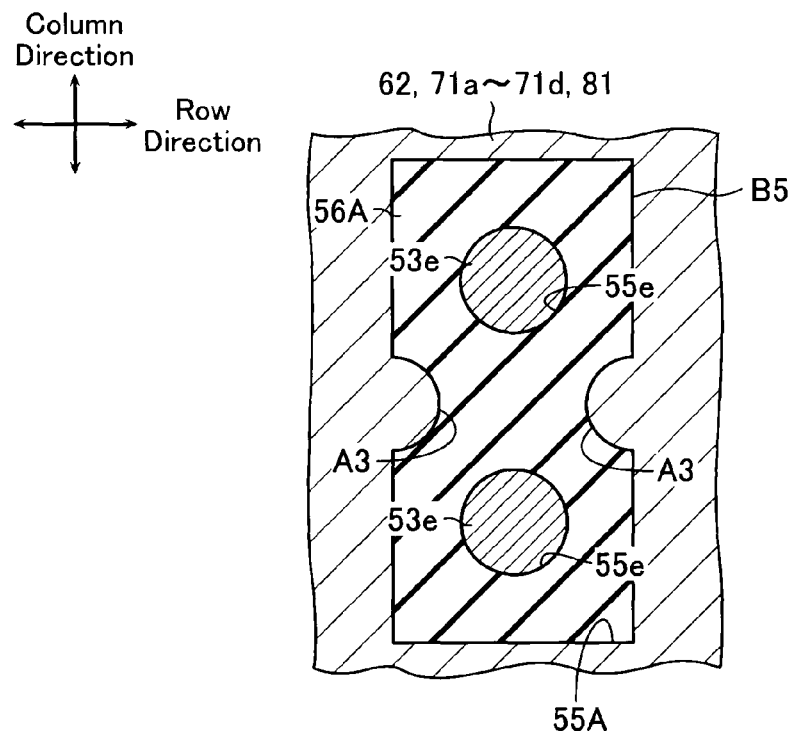
Figure 16:
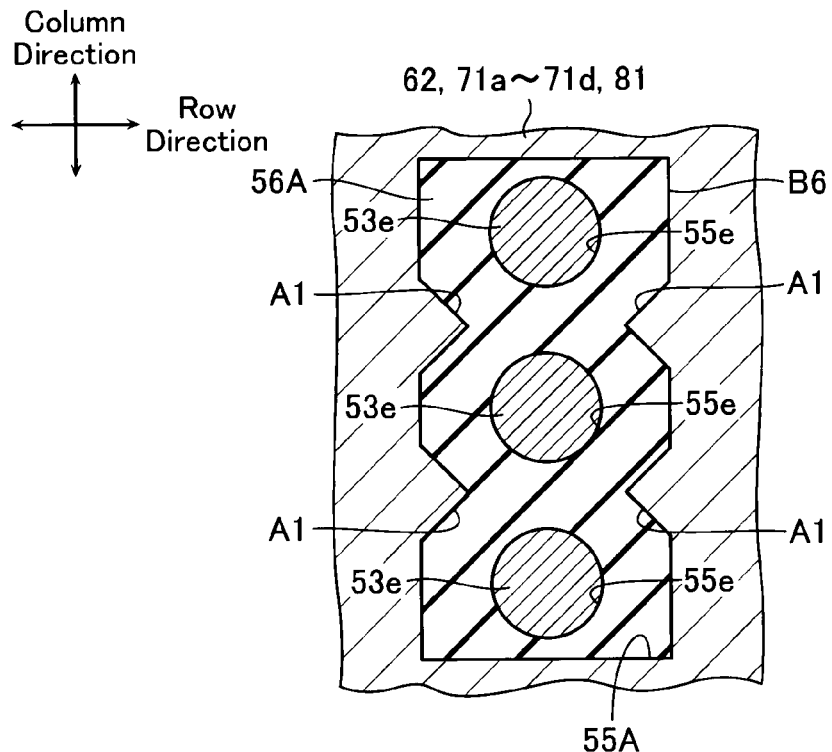

For example, as in the cross-section B2 shown in FIG. 12, the two constricted portions A1 may be positioned misaligned with each other in the direction parallel to the long sides of the cross-section B2 (column direction). For example, as in the cross-section B3 shown in FIG. 13, there may be only one constricted portion A1. For example, as in the cross-section B4 shown in FIG. 14, a constricted portion A2 may have a rectangular shape. For example, as in the cross-section B5 shown in FIG. 15, a constricted portion A3 may have a semicircular shape. For example, as in the cross-section B6 shown in FIG. 16, two pairs of opposing constricted portions A1 (four of the constricted portions A1) may be provided.

Figure 17:
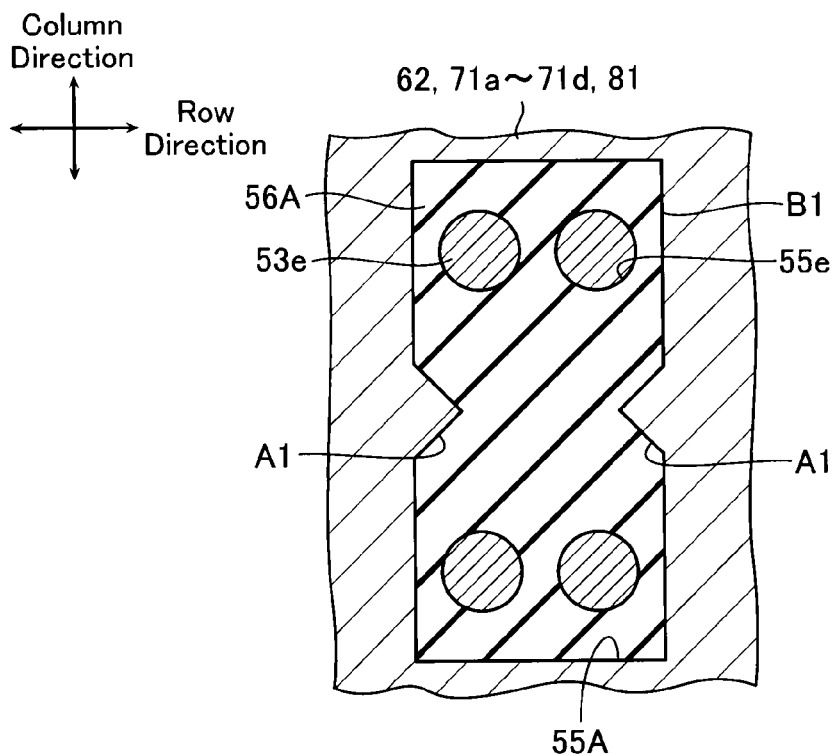

In addition, as shown in the cross-section B1 of FIG. 17 similar to that of the first embodiment, there need not be only two but may also be, for example, four of the plug layers 53e provided to one interlayer insulating layer 56A. In the example shown in FIG. 17, the four plug layers 53e are formed in alignment in the direction parallel to the long sides of the cross-section B1 and in the direction parallel to the short sides of the cross-section B1.

Second Embodiment

[Configuration]

Figure 18:
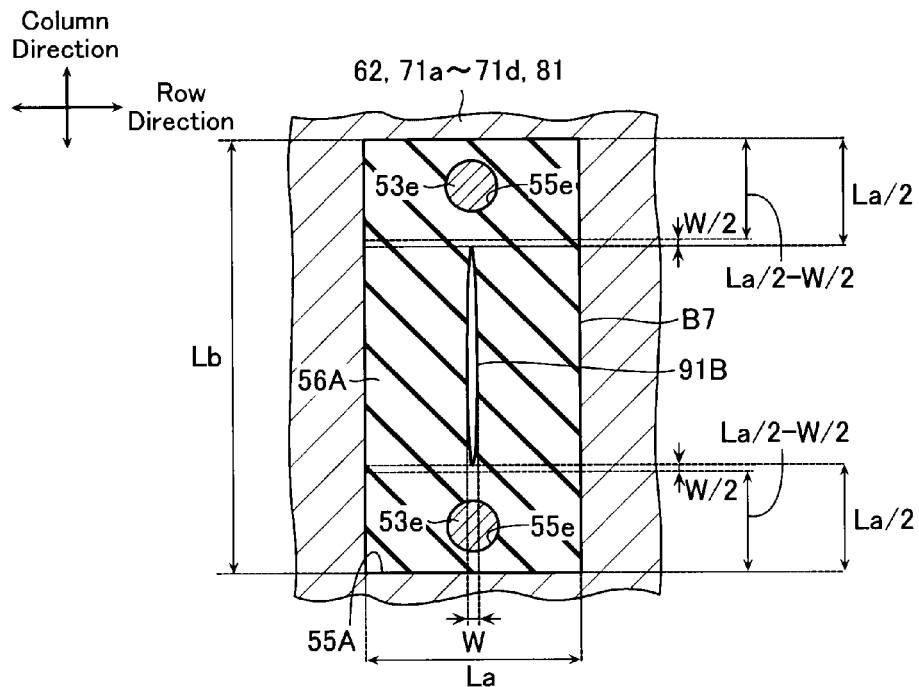
FIG. 18 is a schematic top view showing a second embodiment.

Next, a configuration of a nonvolatile semiconductor memory device in accordance with a second embodiment is described with reference to FIG. 18. Note that in the second embodiment, identical symbols are assigned to configurations similar to those in the first embodiment and descriptions thereof are omitted.

The nonvolatile semiconductor memory device in the second embodiment has an overall configuration which is similar to that of the first embodiment (FIGS. 1-5). The second embodiment differs from the first embodiment in having the interlayer insulating layer 56A (penetrating hole 55A) that has a rectangular shaped cross-section B7 in the horizontal direction but without the constricted portions A1. The second embodiment has its feature in the fact that a position of the plug layer 53e (hole 55e) is determined so as not to be reached by a void 91B.

The cross-section B7 has a pair of short sides of length La extending in the row direction and a pair of long sides of length Lb extending in the column direction. The void 91B is positioned at a center of the cross-section B7 and formed in an elliptical shape in the horizontal direction. The void 91B has a long axis in the column direction and a short axis of length W in the row direction.

The two plug layers 53e (the holes 55e) are formed at a position between the short side (end in the column direction) of the cross-section B7 and a position distant from the short side by a length La/2-W/2. The two plug layers 53e (holes 55e) are formed on an extended line of the long axis of the void 91B. One of the two plug layers 53e is formed in a vicinity of one of the two short sides and the other of the plug layers 53e is formed in a vicinity of the other of the two short sides. That is, a plurality of the plug layers 53e are formed in the vicinities of the two short sides.

[Advantages]

Figure 19:
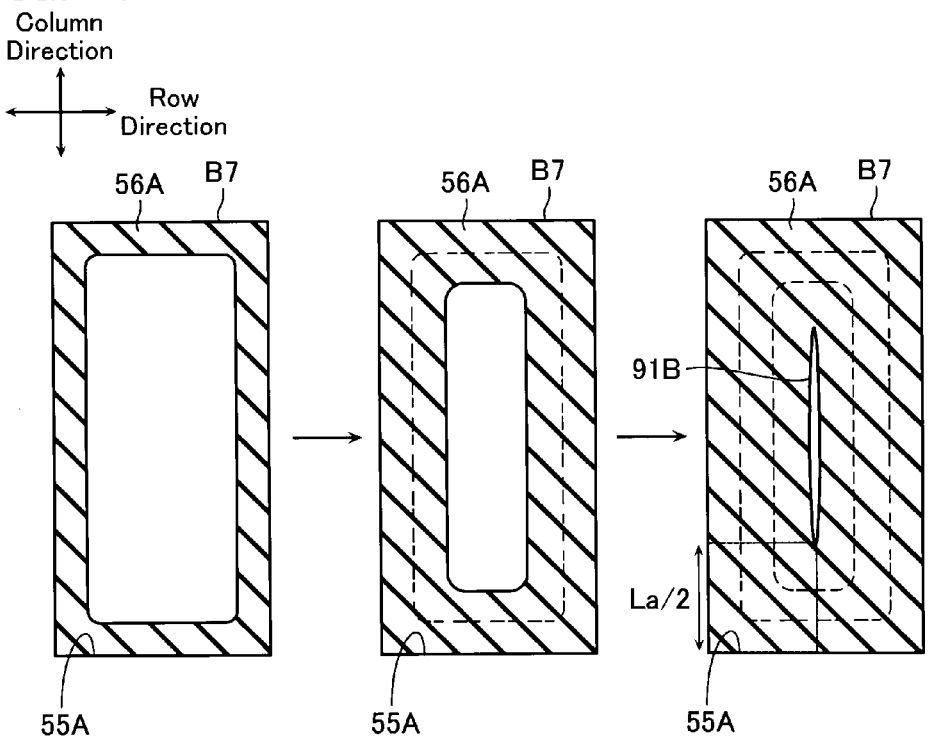
FIG. 19 shows views explaining advantages of the second embodiment.

Next, advantages of the second embodiment are described with reference to FIG. 19. FIG. 19 shows a manufacturing process of the interlayer insulating layer 56A. The interlayer insulating layer 56A is formed sequentially from side surfaces of the penetrating hole 55A using CVD, as shown in FIG. 19. Consequently, as shown in the right side of FIG. 19, the void 91B is not formed in a position between the short side of the cross-section B7 and a position distant from the short side in the column direction by a length La/2-W/2 even in the worst case. However, since the void 91B is formed due to non-uniformity growth of the interlayer insulating layer 56A, there is a certain variation in size of the void 91B. In consideration of this variation, the two plug layers 53e (holes 55e) of the present embodiment are formed at a position close to the short side (end in the column direction) of the cross-section B7 seen from a position distant from the short side by a length La/2-W/2. As a result, the two plug layers 53e (holes 55e) are formed unreached by the void 91B and there is no short-circuiting due to the void 91B.

Third Embodiment

[Configuration]

Figure 20:
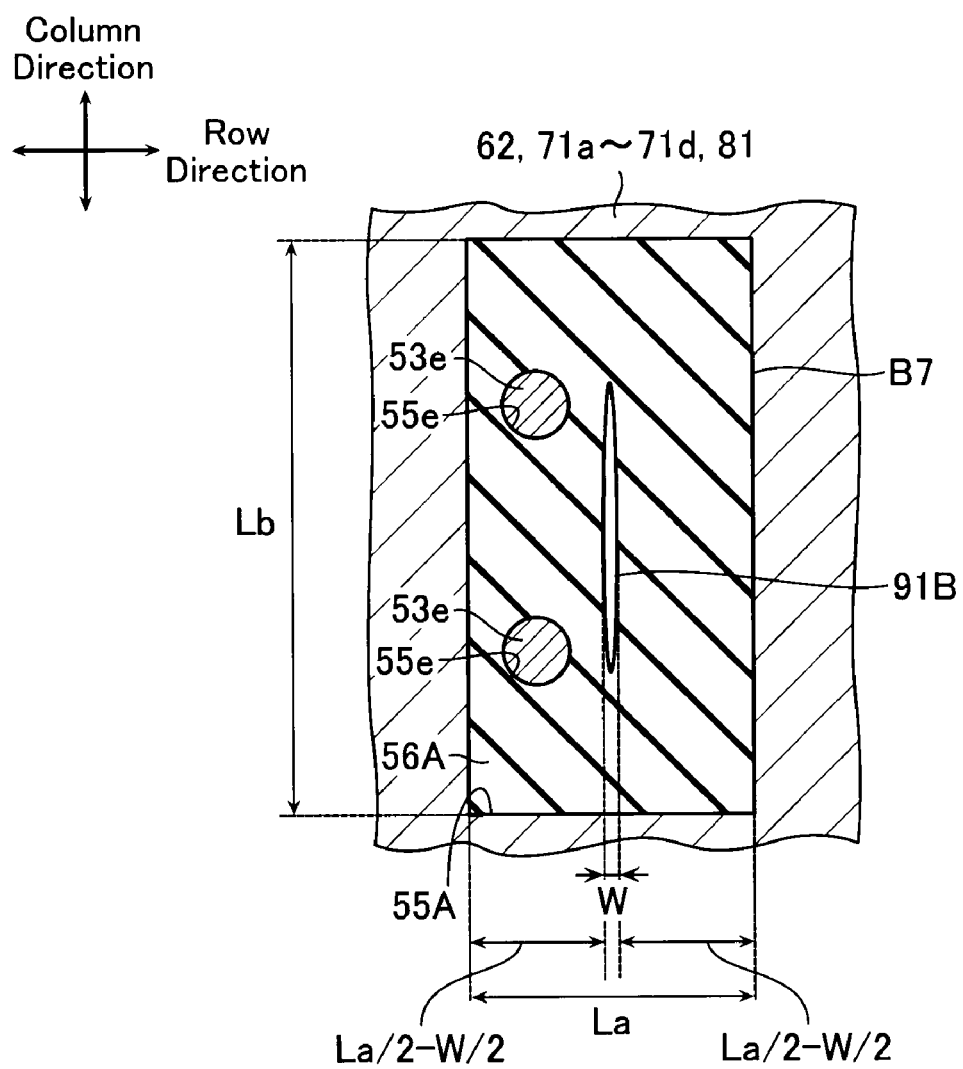
FIG. 20 is a schematic top view showing a third embodiment.

Next, a configuration of a nonvolatile semiconductor memory device in accordance with a third embodiment is described with reference to FIG. 20. Note that in the third embodiment, identical symbols are assigned to configurations similar to those in the first and second embodiments and descriptions thereof are omitted.

The nonvolatile semiconductor memory device in the third embodiment has an overall configuration which is similar to that of the second embodiment. Moreover, the third embodiment is similar to the second embodiment also in the fact that the interlayer insulating layer 56A (penetrating hole 55A) has a rectangular shaped cross-section B7 in the horizontal direction without the constricted portions A1 and has the void 91B, and further in the fact that a position of the plug layer 53e (hole 55e) is determined so as not to be reached by the void 91B. On the other hand, the plug layer 53e (hole 55e) in the third embodiment is formed in a different region to where it is formed in the second embodiment.

The two plug layers 53e (the holes 55e) are formed at a position between the long side (end in the row direction) of the cross-section B7 and a position distant from the long side by a length La/2-W/2. The two plug layers 53e are both formed only in a vicinity of one of the two long sides and are not formed in a vicinity of the other of the long sides. Note that one of the two plug layers 53e may be formed in a vicinity of one of the two long sides and the other of the plug layers 53e formed in a vicinity of the other of the two long sides. That is, a plurality of the plug layers 53e may be formed in the vicinities of the two long sides.

[Advantages]

Next, advantages of the third embodiment are described. As shown in the above-described FIG. 19 (second embodiment), the void 91B is not formed in a position between the long side of the cross-section B7 and a position distant from the long side by a length La/2-W/2 even in the worst case. In consideration of this, the two plug layers 53e (holes 55e) of the present embodiment are formed at a position close to the long side of the cross-section B7 seen from a position distant from the long side by a length La/2-W/2. That is, the two plug layers 53e (holes 55e) are formed unreached by the void 91B and there is no short-circuiting due to the void 91B.

Fourth Embodiment

[Configuration]

Figure 21:
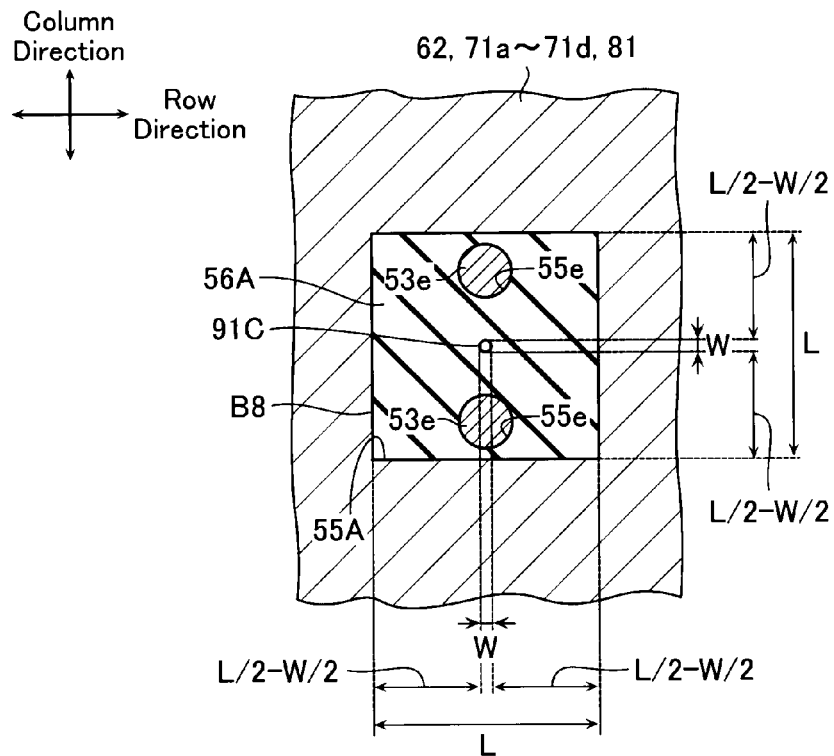
FIG. 21 is a schematic top view showing a fourth embodiment.

Next, a configuration of a nonvolatile semiconductor memory device in accordance with a fourth embodiment is described with reference to FIG. 21. Note that in the fourth embodiment, identical symbols are assigned to configurations similar to those in the first through third embodiments and descriptions thereof are omitted.

The nonvolatile semiconductor memory device in the fourth embodiment has an overall configuration which is similar to that of the first embodiment (FIGS. 1-5). The fourth embodiment differs from the first embodiment in having the interlayer insulating layer 56A (penetrating hole 55A) that has a cross-section B8 in the horizontal direction that is of square shape and does not include the constricted portions A1. The fourth embodiment, similarly to the second embodiment, has its feature in the fact that a position of the plug layer 53e (hole 55e) is determined so as not to be reached by a void 91C.

The cross-section B8 has sides of length L extending in the column direction and the row direction. The void 91C is positioned at a center of the cross-section B8 and formed in a circular shape of diameter W in the horizontal direction.

The two plug layers 53e (the holes 55e) are formed at a position between the sides (end in the row or column direction) of the cross-section B8 and a position distant from the sides by a length L/2-W/2.

[Advantages]

Figure 22:
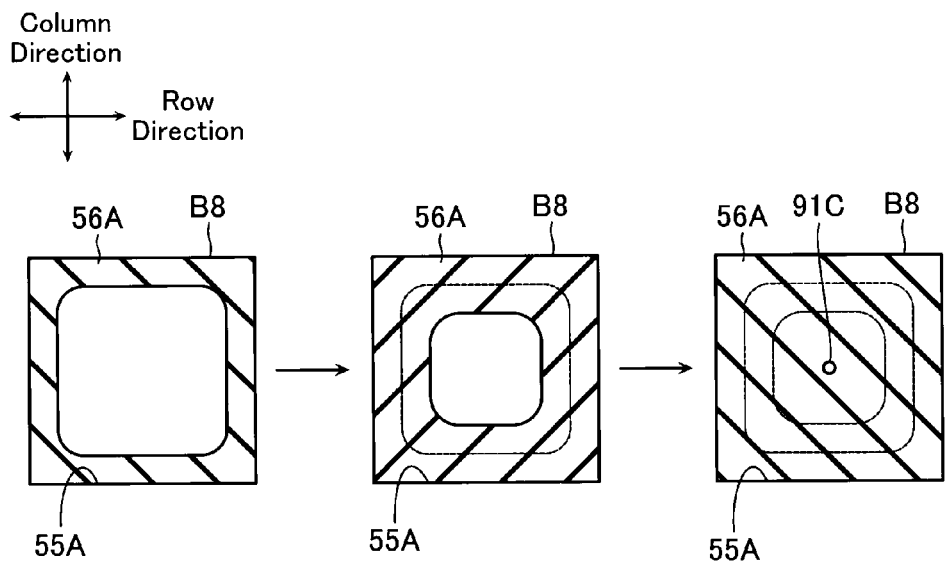
FIG. 22 is shows views explaining advantages of the fourth embodiment.

Next, advantages of the fourth embodiment are described with reference to FIG. 22. FIG. 22 shows a manufacturing process of the interlayer insulating layer 56A. The interlayer insulating layer 56A is formed sequentially from side surfaces of the square shaped penetrating hole 55A, as shown in FIG. 22. Consequently, as shown in the right side of FIG. 22, the void 91C is ultimately formed substantially only at a center of the cross-section B8 of the interlayer insulating layer 56A. Accordingly, the void 91C is not formed in a position between the sides of the cross-section B8 and a position distant from the ends in the row direction (column direction) in the row direction (column direction) by a length L/2-W/2 even in the worst case. In consideration of this, the two plug layers 53e (holes 55e) of the present embodiment are formed at a position close to the sides of the cross-section B8 seen from a position distant from the sides by a length L/2-W/2. That is, the two plug layers 53e (holes 55e) are formed unreached by the void 91C and there is no short-circuiting due to the void 91C.

Fifth Embodiment

[Configuration]

Figure 23:
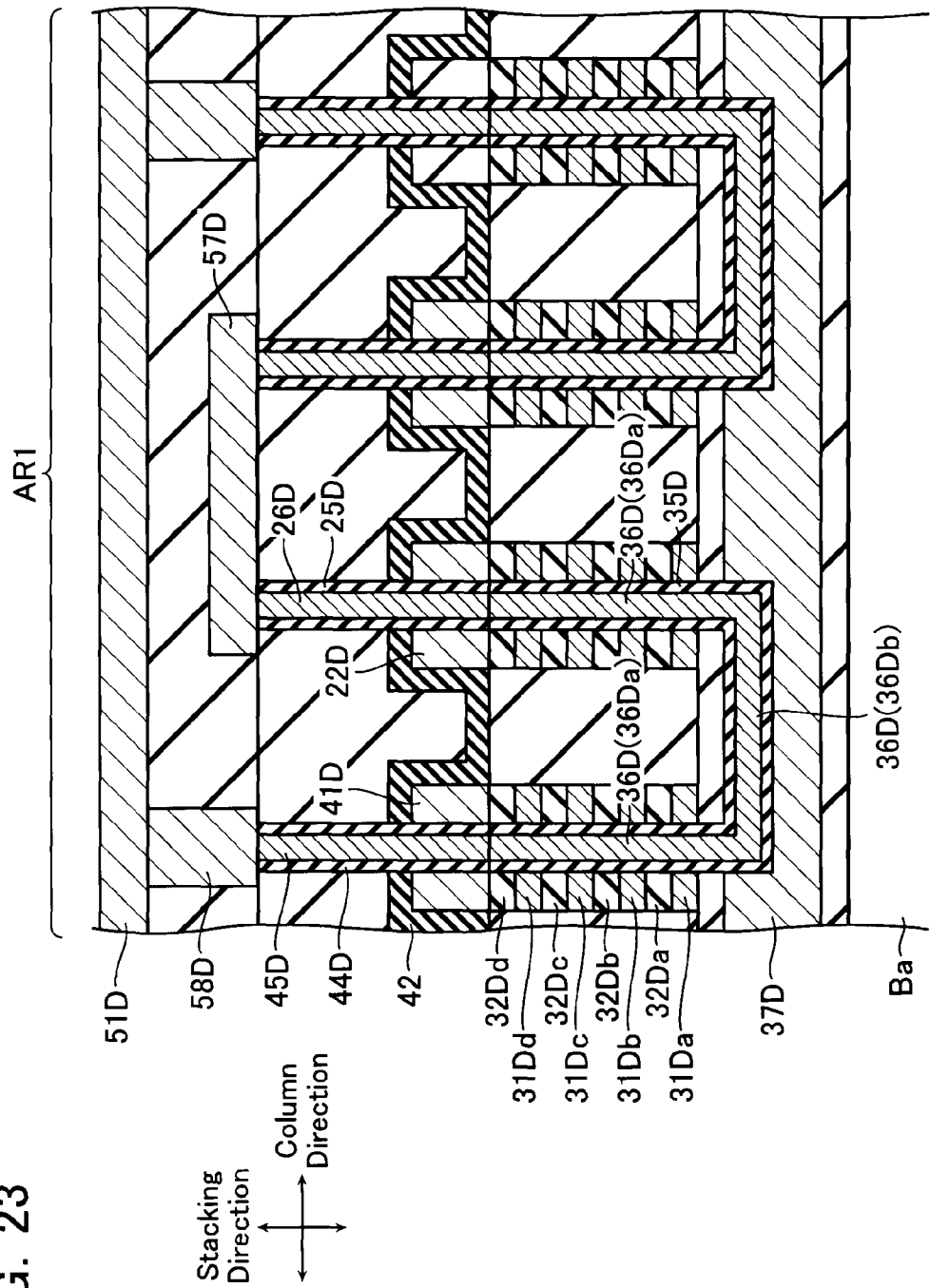
FIG. 23 is a cross-sectional view showing a fifth embodiment.

Next, a configuration of a nonvolatile semiconductor memory device in accordance with a fifth embodiment is described with reference to FIG. 23. FIG. 23 is a cross-sectional view showing the nonvolatile semiconductor memory device in accordance with the fifth embodiment. Note that in the fifth embodiment, identical symbols are assigned to configurations similar to those in the first embodiment and descriptions thereof are omitted.

Now, in the first embodiment, the memory columnar semiconductor layer 36 is formed in an I shape extending in the stacking direction as viewed from the row direction. In contrast, as shown in FIG. 23, a memory columnar semiconductor layer 36D in accordance with the fifth embodiment is formed in a U shape as viewed from the row direction. That is, the memory columnar semiconductor layer 36D includes a pair of columnar portions 36Da extending in the stacking direction and a joining portion 36Db configured to join lower ends of that pair of columnar portions 36Da. Word line conductive layers 31Da-31Dd and insulating layers 32Da-32Dd are formed in stripes extending in the row direction with a certain pitch in the column direction so as to surround the columnar portions 36Da with a memory gate insulating layer 35D interposed therebetween.

In addition, the fifth embodiment includes a back gate conductive layer 37D formed around the joining portion 36Db with the memory gate insulating layer 35D interposed therebetween. The back gate conductive layer 37D is constituted by polysilicon.

Moreover, in the fifth embodiment, a source side columnar semiconductor layer 26D is formed extending in the stacking direction from an upper surface of one of the pair of columnar portions 36Da, and a drain side columnar semiconductor layer 45D is formed extending in the stacking direction from an upper surface of the other of the pair of columnar portions 36Da. A source side conductive layer 22D and a drain side conductive layer 41D are formed in stripes extending in the row direction and having a certain pitch in the column direction. The source side conductive layer 22D is formed around the source side columnar semiconductor layer 26D with a source side gate insulating layer 25D interposed therebetween, and the drain side conductive layer 41D is formed around the drain side columnar semiconductor layer 45D with a drain side gate insulating layer 44D interposed therebetween.

An upper surface of the source side columnar semiconductor layer 26D is connected to a third wiring layer 57D. The third wiring layer 57D functions as the source line SL. An upper surface of the drain side columnar semiconductor layer 45D is connected to a first wiring layer 51D (bit line BL) via a plug layer 58D.

Note that the fifth embodiment includes the penetrating hole 55A and the interlayer insulating layer 56A similar to those of the first embodiment, although these are not shown in the drawings.

[Advantages]

The nonvolatile semiconductor memory device in accordance with the fifth embodiment has a configuration similar to that of the first embodiment, and thus displays similar advantages to the first embodiment.

Other Embodiments

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, the configuration of the fifth embodiment may be applied to the variant examples of the first embodiment, and to the second through fourth embodiments. For example, in the above-described first through fifth embodiments, the plug layers 53a-53e have a cross-section of circular shape in the horizontal direction with respect to the semiconductor substrate Ba, but the cross-section may be of an elliptical shape.

What is claimed is:

1. A nonvolatile semiconductor memory device, comprising:

a plurality of memory strings each having a plurality of electrically rewritable memory transistors connected in series; and a control circuit for controlling the memory strings, each of the memory strings comprising:

a semiconductor layer including a columnar portion that extends in a perpendicular direction to a substrate and functioning as a body of the memory transistors;

a charge storage layer formed around a side surface of the columnar portion and configured to enable storage of a charge; and a plurality of first conductive layers formed around the side surface of the columnar portion and the charge storage layer and functioning as gates of the memory transistors, the control circuit comprising:

a plurality of second conductive layers formed in the same layers as the plurality of first conductive layers;

an insulating layer formed penetrating the plurality of second conductive layers in the perpendicular direction; and a plurality of plug layers formed penetrating the insulating layer in the perpendicular direction, the insulating layer having a rectangular shaped cross-section with a constricted portion in a horizontal direction to the substrate, and the constricted portion being positioned on a long side of the cross-section.

2. The nonvolatile semiconductor memory device according to claim 1, wherein the plurality of plug layers are disposed in a position other than the vicinity of a line connecting the constricted portions.

3. The nonvolatile semiconductor memory device according to claim 1, wherein two of the plug layers are each formed such that the distance from one of the two long sides of the cross-section is equal to that from the other.

4. The nonvolatile semiconductor memory device according to claim 1, wherein two of the plug layers are each formed at a position between a short side of the cross-section and the constricted portion.

5. The nonvolatile semiconductor memory device according to claim 1, wherein the plurality of plug layers are disposed in alignment in a direction parallel to the long side of the cross-section and in alignment in a direction parallel to a short side of the cross-section.

6. The nonvolatile semiconductor memory device according to claim 1, wherein the constricted portion is formed in a midpoint vicinity of the long side of the cross-section.

7. The nonvolatile semiconductor memory device according to claim 1, wherein a plurality of the constricted portions are formed for one cross-section.

8. The nonvolatile semiconductor memory device according to claim 7,
wherein a pair of constricted portions are formed in alignment in a direction parallel to a short side of the cross-section.

9. The nonvolatile semiconductor memory device according to claim 1,
wherein the constricted portion has a triangular shape.

10. The nonvolatile semiconductor memory device according to claim 1,
wherein the constricted portion has a rectangular shape.

11. The nonvolatile semiconductor memory device according to claim 1,
wherein the constricted portion has a semicircular shape.

12. The nonvolatile semiconductor memory device according to claim 1,
wherein the semiconductor layer comprises a joining portion configured to join lower ends of a pair of the columnar portions.

* * * * *